(12) United States Patent
Lea et al.

(10) Patent No.: US 11,693,561 B2
(45) Date of Patent: *Jul. 4, 2023

(54) APPARATUSES AND METHODS FOR SIMULTANEOUS IN DATA PATH COMPUTE OPERATIONS

(71) Applicant: Micron Technology, Inc., Boise, ID (US)

(72) Inventors: Perry V. Lea, Eagle, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/829,850

(22) Filed: Jun. 1, 2022

(65) Prior Publication Data

US 2022/0291834 A1    Sep. 15, 2022

Related U.S. Application Data

(63) Continuation of application No. 17/063,376, filed on Oct. 5, 2020, now Pat. No. 11,372,550, which is a
(Continued)

(51) Int. Cl.
*G06F 3/06* (2006.01)
*G11C 7/10* (2006.01)
(Continued)

(52) U.S. Cl.
CPC ............ *G06F 3/061* (2013.01); *G06F 3/0635* (2013.01); *G06F 3/0665* (2013.01);
(Continued)

(58) Field of Classification Search
None
See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102007539 | 4/2011 |
| CN | 102141905 | 8/2011 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Michael Alsip
(74) *Attorney, Agent, or Firm* — Brooks, Cameron & Huebsch, PLLC

(57) ABSTRACT

The present disclosure includes apparatuses and methods for simultaneous in data path compute operations. An apparatus can include a memory device having an array of memory cells and sensing circuitry selectably coupled to the array. A plurality of shared I/O lines can be configured to move data from the array of memory cells to a first portion of logic stripes and a second portion of logic stripes for in data path compute operations associated with the array. The first portion of logic stripes can perform a first number of operations on a first portion of data moved from the array of memory cells to the first portion of logic stripes while the second portion of logic stripes perform a second number of operations on a second portion of data moved from the array of memory cells to the second portion of logic stripes during a first time period.

19 Claims, 11 Drawing Sheets

Related U.S. Application Data continuation of application No. 16/434,621, filed on Jun. 7, 2019, now Pat. No. 10,795,582, which is a continuation of application No. 15/626,790, filed on Jun. 19, 2017, now Pat. No. 10,318,168.

(51) Int. Cl.

| | | |
|---|---|---|
| *G11C 7/22* | (2006.01) | |
| *G11C 11/4076* | (2006.01) | |
| *G11C 11/4091* | (2006.01) | |
| *G11C 11/4093* | (2006.01) | |
| *G11C 11/4094* | (2006.01) | |
| *G11C 11/4096* | (2006.01) | |
| *G11C 11/4097* | (2006.01) | |

(52) U.S. Cl.
CPC .......... *G06F 3/0689* (2013.01); *G11C 7/1006* (2013.01); *G11C 7/106* (2013.01); *G11C 7/1009* (2013.01); *G11C 7/222* (2013.01); *G11C 11/4076* (2013.01); *G11C 11/4091* (2013.01); *G11C 11/4093* (2013.01); *G11C 11/4094* (2013.01); *G11C 11/4096* (2013.01); *G11C 11/4097* (2013.01); *G11C 2207/2245* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,175,535 B1 | 1/2001 | Dhong et al. |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,114,014 B2 | 9/2006 | Yatziv et al. |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,471,590 B2 | 12/2008 | Davis et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |

(56) References Cited

U.S. PATENT DOCUMENTS

| | | |
|---|---|---|
| 8,085,605 B2 | 12/2011 | Yang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,473,669 B2 | 6/2013 | Sinclair |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,595,459 B2 | 11/2013 | Ware et al. |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,959,913 B2 | 5/2018 | Manning |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2001/0053105 A1 | 12/2001 | Elliott et al. |
| 2002/0059355 A1 | 5/2002 | Peleg et al. |
| 2003/0167426 A1 | 9/2003 | Slobodnik |
| 2003/0200378 A1 | 10/2003 | Kirsch |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0118721 A1 | 5/2007 | Stewart et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0093663 A1 | 4/2011 | McAuley et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0012717 A1 | 1/2015 | Song |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0085589 A1 | 3/2015 | Lu et al. |
| 2015/0120987 A1 | 4/2015 | Wheeler |
| 2015/0134713 A1 | 5/2015 | Wheeler |
| 2015/0186055 A1 | 7/2015 | Darragh |
| 2015/0193153 A1 | 7/2015 | Bauman et al. |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |

(56) References Cited

U.S. PATENT DOCUMENTS

| | | | |
|---|---|---|---|
| 2015/0356009 | A1 | 12/2015 | Wheeler et al. |
| 2015/0356022 | A1 | 12/2015 | Leidel et al. |
| 2015/0357007 | A1 | 12/2015 | Manning et al. |
| 2015/0357008 | A1 | 12/2015 | Manning et al. |
| 2015/0357019 | A1 | 12/2015 | Wheeler et al. |
| 2015/0357020 | A1 | 12/2015 | Manning |
| 2015/0357021 | A1 | 12/2015 | Hush |
| 2015/0357022 | A1 | 12/2015 | Hush |
| 2015/0357023 | A1 | 12/2015 | Hush |
| 2015/0357024 | A1 | 12/2015 | Hush et al. |
| 2015/0357047 | A1 | 12/2015 | Tiwari |
| 2016/0062672 | A1 | 3/2016 | Wheeler |
| 2016/0062673 | A1 | 3/2016 | Tiwari |
| 2016/0062692 | A1 | 3/2016 | Finkbeiner et al. |
| 2016/0062733 | A1 | 3/2016 | Tiwari |
| 2016/0063284 | A1 | 3/2016 | Tiwari |
| 2016/0064045 | A1 | 3/2016 | La Fratta |
| 2016/0064047 | A1 | 3/2016 | Tiwari |
| 2016/0098208 | A1 | 4/2016 | Willcock |
| 2016/0098209 | A1 | 4/2016 | Leidel et al. |
| 2016/0110135 | A1 | 4/2016 | Wheeler et al. |
| 2016/0125919 | A1 | 5/2016 | Hush |
| 2016/0154596 | A1 | 6/2016 | Willcock et al. |
| 2016/0155482 | A1 | 6/2016 | La Fratta |
| 2016/0188250 | A1 | 6/2016 | Wheeler |
| 2016/0196142 | A1 | 7/2016 | Wheeler et al. |
| 2016/0196856 | A1 | 7/2016 | Tiwari et al. |
| 2016/0225422 | A1 | 8/2016 | Tiwari et al. |
| 2016/0266873 | A1 | 9/2016 | Tiwari et al. |
| 2016/0266899 | A1 | 9/2016 | Tiwari |
| 2016/0267951 | A1 | 9/2016 | Tiwari |
| 2016/0292080 | A1 | 10/2016 | Leidel et al. |
| 2016/0306567 | A1 | 10/2016 | Yang |
| 2016/0365129 | A1 | 12/2016 | Willcock |
| 2016/0371033 | A1 | 12/2016 | La Fratta et al. |
| 2017/0052906 | A1 | 2/2017 | Lea |

FOREIGN PATENT DOCUMENTS

| | | |
|---|---|---|
| CN | 105027212 | 11/2015 |
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |
| WO | 2016144726 | 9/2016 |

OTHER PUBLICATIONS

Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
Singh, "Difference between Single and Multiprocessor Systems", Jan. 4, 2015, (2 pgs.), retrieved from http://allroundexpert.blogspot.com/2015/01/difference-between-single-and_29.html.
Office Action for related China Patent Application No. 201810620747. 5, dated Jun. 2, 2020, 25 pages.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs).
U.S. Appl. No. 13/796,189, entitled, "Performing Complex Arithmetic Functions in a Memory Device," filed Mar. 12, 2013, (23 pgs ).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Fig. 9A

| | t1 | t2 | t3 | t4 | t5 | t6 | t7 | t8 | t9 | t10 | t11 | t12 | t13 | t14 | t15 | t16 |
|---|---|---|---|---|---|---|---|---|---|---|---|---|---|---|---|---|
| MIO (955) | R1S1 | R2S1 | R1S2 | R2S2 | R1S3 | R2S3 | R1S4 | R2S4 | R1S5 | R2S5 | | | | | | |
| L1 (924-1) | R1S1 | R1S1 | | | | | | | | | | | | | | |
| L2 (924-2) | | R2S1 | XOR | | | | | | | | | | | | | |
| L3 (924-3) | | | | AND | | | | | | | | | | | | |
| L4 (924-4) | | | | | OR | | | | | | | | | | | |
| L5 (924-5) | | | | | | SHL | | | | | | | | | | |
| L6 (924-6) | | | | | | | XOR | | | | | | | | | |
| L7 (924-7) | | | R1S2 | R1S2 | | | | AND | | | | | | | | |
| L8 (924-8) | | | | R2S2 | XOR | | | SHL | | | | | | | | |
| L9 (924-9) | | | | | | AND | | | R1S5 | | | | | | | |
| L10 (924-10) | | | | | | | OR | | XOR | | | | | | | |
| L11 (924-11) | | | | | | | | | R2S5 | XOR | | AND | | | | |
| L12 (924-12) | | | | | | | | | | AND | OR | | | | | |
| L13 (924-13) | | | | | R1S3 | R2S3 | XOR | | | | | | | | | |
| L14 (924-14) | | | | | | | | | | | | | OR | | | |
| L15 (924-15) | | | | | | | | | | OR | | | | SHL | | |
| L16 (924-16) | | | | | | | | | | SHL | | | | | | |
| L17 (924-17) | | | | | | | | | | | XOR | | | | XOR | |
| L18 (924-18) | | | | | | | | | | | | AND | | | | AND |

997-1 → t1, 997-2 → t2, 997-3 → t3, 997-4 → t4, 997-5 → t5, 997-6 → t6, 997-7 → t7, 997-8 → t8, 997-9 → t9, 997-10 → t10, 997-11 → t11, 997-12 → t12, 997-13 → t13, 997-14 → t14, 997-15 → t15, 997-16 → t16

Groupings: 924-A { L1–L6 }, 924-B { L7–L12 }, 924-C { L13–L18 }

APPARATUSES AND METHODS FOR SIMULTANEOUS IN DATA PATH COMPUTE OPERATIONS

PRIORITY INFORMATION

This application is a Continuation of U.S. application Ser. No. 17/063,376, filed Oct. 5, 2020, which is a Continuation of U.S. application Ser. No. 16/434,621, filed Jun. 7, 2019, which issued as U.S. Pat. No. 10,795,582 on Oct. 6, 2020, which is a Continuation of U.S. application Ser. No. 15/626,790, filed Jun. 19, 2017, which issued as U.S. Pat. No. 10,318,168 on Jun. 11, 2019, the contents of which are included herein by reference.

TECHNICAL FIELD

The present disclosure relates generally to semiconductor memory and methods, and more particularly, to apparatuses and methods for simultaneous in data path compute operations.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be performed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processing-in-memory (PIM) device, in which a processing and/or logic resource may be implemented internally and/or near to a memory (e.g., directly on a same chip as the memory array). A processing-in-memory (PIM) device may save time by reducing and eliminating external communications and may also conserve power.

BRIEF DESCRIPTION OF THE DRAWINGS

FIGS. 9A-9B are schematic diagrams illustrating performance of operations on data values in a memory device in accordance with a number of embodiments of the present disclosure.

DETAILED DESCRIPTION

Figure 1A:
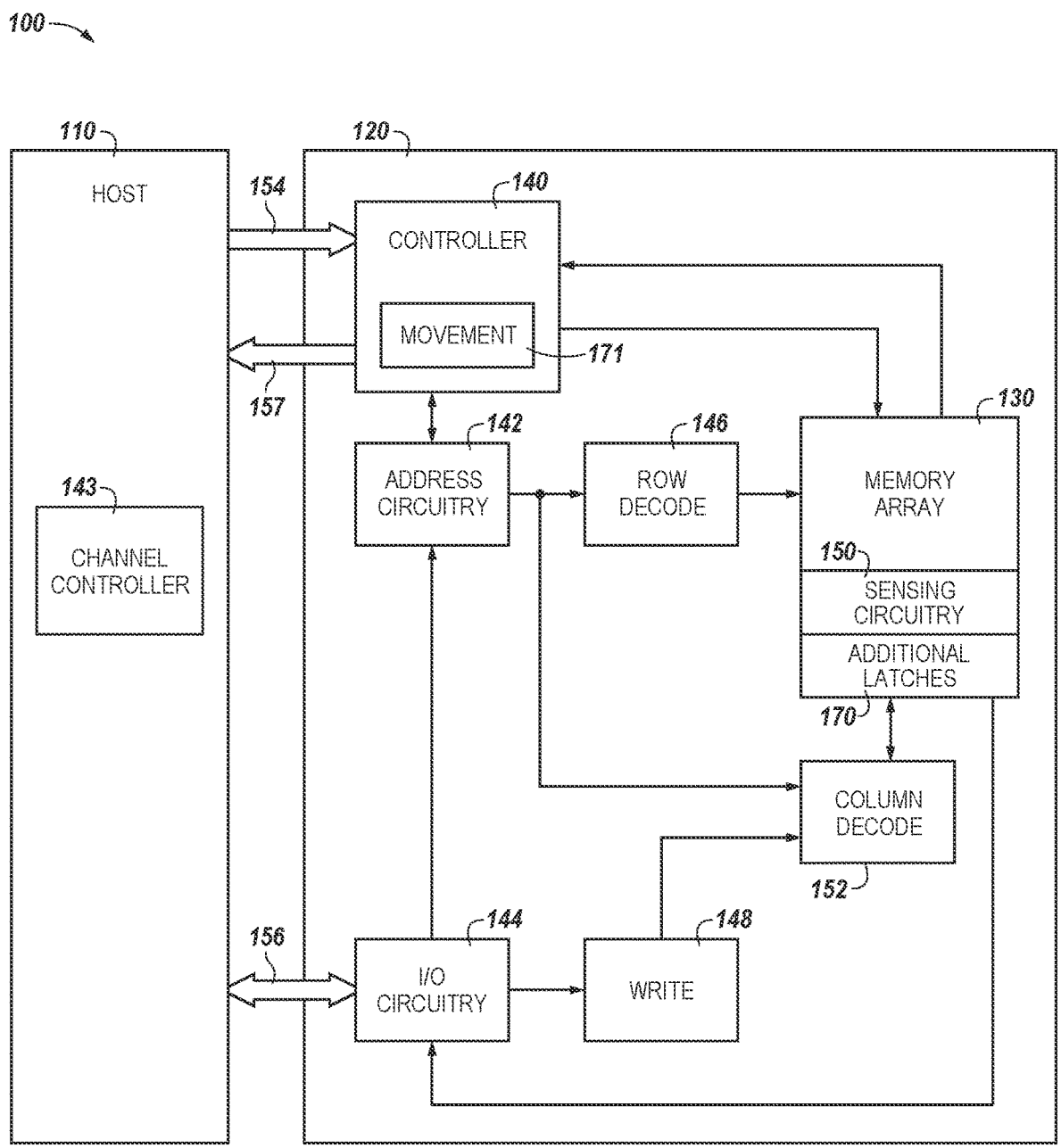
FIG. 1A is a block diagram of an apparatus in the form of a computing system including a memory device in accordance with a number of embodiments of the present disclosure.

The present disclosure includes apparatuses and methods for simultaneous in data path compute operations. In at least one embodiment, an apparatus includes a memory device having an array of memory cells and sensing circuitry selectably coupled to the array of memory cells. In various embodiments, the memory device may be a processing in memory (PIM) device and the sensing circuitry may include a sense amplifier and compute component. A plurality of input/output (I/O) lines can be shared as a data path for in data path compute operations associated with the array (e.g., the sensing circuitry may be selectably coupled to columns of memory cells and/or shared I/O lines). The plurality of shared I/O lines can be selectably coupled to a plurality of logic stripes in the data path and are configured to move data from the array of memory cells to the plurality of logic stripes. The plurality of logic stripes can include a first portion of logic stripes and a second portion of logic stripes. The first portion of logic stripes can perform a first number of operations on a first portion of data moved from the array of memory cells to the first portion of logic stripes while the second portion of logic stripes perform a second number of operations on a second portion of data moved from the array of memory cells to the second portion of logic stripes during a first time period.

In a number of embodiments, the first portion of logic stripes can be configured to perform a first program, which is comprised of a number of operations, and the second portion of logic stripes can be configured to perform the first program and/or a different program, which is comprised of a number of different operations, on data sent to the logic stripes. The controller can be configured to send data to a plurality of portions of logic stripes and perform a plurality of programs on the portions of logic stripes. A plurality of programs can be performed simultaneously on the portions of logic stripes.

The plurality of I/O lines can selectably couple row and/or subrows of the array via the sensing circuitry to logic stripes in the data path to move data values from the rows and/or subrows of the array to the logic stripes. As used herein, a "subrow" is intended to mean a predetermined subset of memory cells of the row of the array that stores a predetermined number of data values. For example, one subrow of a row may be a predetermined 1024 (1K) memory cells of a row having 16,384 (16K) memory cells, thereby resulting in 16 subrows of the row (e.g., as shown at 428-1, 428-2, . . . , 428-16 and described in connection with FIG. 4 and elsewhere herein). An operation may be performed (e.g., as directed by a controller) on data values from the rows and/or subrows of the arrays using the compute components in the logic stripes substantially simultaneously with movement of additional data values from the rows and/or subrows of the arrays to the logic stripes.

Ordinal numbers such as first and second are used herein to assist in correlating and/or distinguishing between similar and/or selectably coupled components (e.g., subarrays of memory cells, data values and associated compute components, subrows of memory cells and associated compute components, logic stripes and associated compute components, connection circuitry and associated compute components and/or logic stripes, etc.) and are not used to indicate a particular ordering and/or relationship between the components, unless the context clearly dictates otherwise (e.g., by using terms such as adjacent, etc.).

Similarly, as described herein, a controller may be configured to direct, in a first operation cycle, a first parallel movement (e.g., via the shared I/O lines) of a number of a plurality of data values of the first subrow to a corresponding first logic stripe operation cycle in a time frame of around 2 to 60 nanoseconds (ns). The controller being configured to direct, in a second operation cycle, a second parallel movement of a number of a plurality of data values of the second subrow to a corresponding second logic stripe in a time frame of around 2 to 60 nanoseconds (ns), which may be, but is not necessarily, the next, e.g., adjacent, 2-60 ns time frame after performance of the first operation cycle.

A shared I/O line (e.g., as shown at 155 and described in connection with FIG. 1B and elsewhere herein) serves as a data path associated with the memory array (e.g., as shown at 130 and described in connection with FIG. 1A and elsewhere herein). The shared I/O line couples sensing circuitry (e.g., as shown at 150 and described in connection with FIG. 1A and elsewhere herein) to logic stripes (e.g., as shown at 424 and described in connection with FIG. 4) that includes sensing circuitry (e.g., as shown at 250 and described in connection with FIG. 2 and elsewhere herein) in the data path of the shared I/O line. The logic stripe, associated with the data path of the shared I/O line, has a pitch equal to that of the data path and that is a function of a pitch of digit lines (e.g., as shown at 205 and described in connection with FIG. 2 and elsewhere herein) to the array of memory cells. For example, the compute component has a pitch that is an integer multiple of the pitch of digit lines to the array of memory cells.

As used herein, a "shared I/O line" is intended to a mean an I/O line that is local to the array in a data path that has a pitch which is a function of a pitch of the array of memory cells. The shared I/O may be located on a bank (e.g., as shown at 121-1 and described in connection with FIG. 1B and elsewhere herein) of the array of memory and may be multiplexed to a plurality of columns of the array (e.g., complementary digit lines to a DRAM array). The shared I/O is different and distinct from the I/O circuitry associated with the array that is intended to moved data to and from the array according to an array protocol such as DDR4 and/or to move data onto and off of a memory device (e.g., as shown at 120 and described in connection with FIG. 1A and elsewhere herein) in connection with a host (e.g., as shown at 110 and described in connection with FIG. 1A and elsewhere herein).

In some embodiments, the array may have a plurality of shared I/O lines for the data path local to the array and each logic stripe may have a plurality of compute components (e.g., as shown at 431-1, 431-2, . . . , 431-Z and described in connection with FIG. 4 and elsewhere herein). Each of the plurality of compute components is associated with at least one of the plurality of shared I/O lines of the data path. In some embodiments, one of each of the plurality of compute components may be associated with a particular one of the plurality of shared I/O lines of the data path.

In various embodiments, each of the plurality of compute components may be shifted to another one of the plurality of shared I/O lines of the data path. For example, the number of columns and/or memory cells (e.g., 16,384 columns and/or memory cells, among other possible configurations) of a row (e.g., as shown at 319 and described in connection with FIG. 3 and elsewhere herein) may be multiplexed such that, for example, 16 subrows are obtained by selecting for coupling to, and parallel movement of data values via, the plurality of shared I/O lines (e.g., 1024 individual shared I/O lines) a contiguous plurality of columns and/or memory cells in the row (16 subrows each having 1024 adjacent columns and/or memory cells, as shown in FIG. 4) such that data values from the contiguous memory cells (e.g., 1024 data values) may be moved in parallel. Alternatively or in addition, the number of columns and/or memory cells of the row may be multiplexed, for example, such that the 16 subrows may be obtained by selecting for coupling to, and parallel movement of data values, via the shared I/O lines, every sixteenth column and/or memory cell in the row such that data values from every sixteenth memory cell (e.g., 1024 data values) may be moved in parallel. In some embodiments, the array may be a DRAM array and sensing circuitry used to sense and/or amplify data values in selected memory cells may include a sense amplifier and/or a compute component.

The memory device 120 includes a controller (e.g., as shown at 140 and described in connection with FIG. 1A and elsewhere herein). Among other functions, the controller 140 may be configured to direct movement (e.g., via movement component 171 associated with the controller) of a data value from a row of memory cells (e.g., a selected subrow thereof) in the array to a logic stripe associated with one of the plurality of shared I/O lines of the data path.

As described in more detail below, the embodiments may allow a host system to allocate a number of locations (e.g., arrays, subarrays and/or portions of subarrays, such as row and subrows thereof) in one or more DRAM banks to hold (e.g., store) and/or process data. A host system and a controller may perform the address resolution on an entire block of program instructions (e.g., PIM command instructions) and data and direct (e.g., control) allocation, storage, and/or movement (e.g., flow) of data and commands into allocated locations (e.g., subarrays and portions of subarrays) within a destination (e.g., target) bank. Writing and/or reading data and/or executing commands in the DRAM array (e.g., movement of data values for performing operations by a logic stripe, as described herein) may utilize a normal DRAM read/write path to the DRAM device. As the reader will appreciate, while a DRAM-style memory array for a PIM device is discussed with regard to examples of in data path compute operations presented herein, embodiments are not limited to a PIM DRAM implementation.

The memory devices described herein may use a number of controllers for a bank of subarrays, controllers for individual subarrays, and/or controllers for latch components (e.g., each controller being a sequencer, a state machine, a microcontroller, a sub-processor, ALU circuitry, or some other type of controller) to execute a set of instructions to perform an operation on data (e.g., one or more operands). As used herein, an operation may be, for example, a Boolean logical operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of logical operations.

The present disclosure describes enablement of in data path compute operations (e.g., PIM operations, such as AND, OR, refresh, row copy, shift, add, multiply, etc.) to be performed on data values stored by memory cells (e.g., when moved to a compute component, as described herein) substantially simultaneously with performance of, for example, read and/or write operations on data values from a same bank, a same subarray in the same bank, and/or a same row in the same subarray (e.g., in a DRAM array, among other types of memory arrays). For example, the movement operation may be performed on data values stored in a subrow of memory cells in a row of a subarray substantially simultaneously with performance of, for example, logical operations on the same data values or different data values previously moved to a logic stripe in the data path (e.g., to a selected logic stripe) as directed by a controller and/or a host, as described herein. Accordingly, when a subrow is activated to be sensed in an array, a plurality of data values stored by memory cells of the subrow (e.g., data values for the entire subrow) may be moved (e.g., copied, transferred, and/or transported) to sensing circuitry of a corresponding plurality of logic stripes in a data path associated with the array. A plurality of shared I/O lines couples the data values to the plurality of logic stripes in the data path. In some embodiments, a plurality of logic stripes in a compute unit may be associated with each bank section of a bank of an array. The logic stripe associated with a shared I/O may be configured to couple (e.g., directly or indirectly connect, as described herein) to a data path of the shared I/O local to the array. In some embodiments, the sensing circuitry 450, logic stripes 424, and/or compute units 460 and may further be coupled to a data bus connected to the host 110 off the memory device and/or to a data bus that connects a bank of an array to another bank of an array on the memory device.

Figure 3:
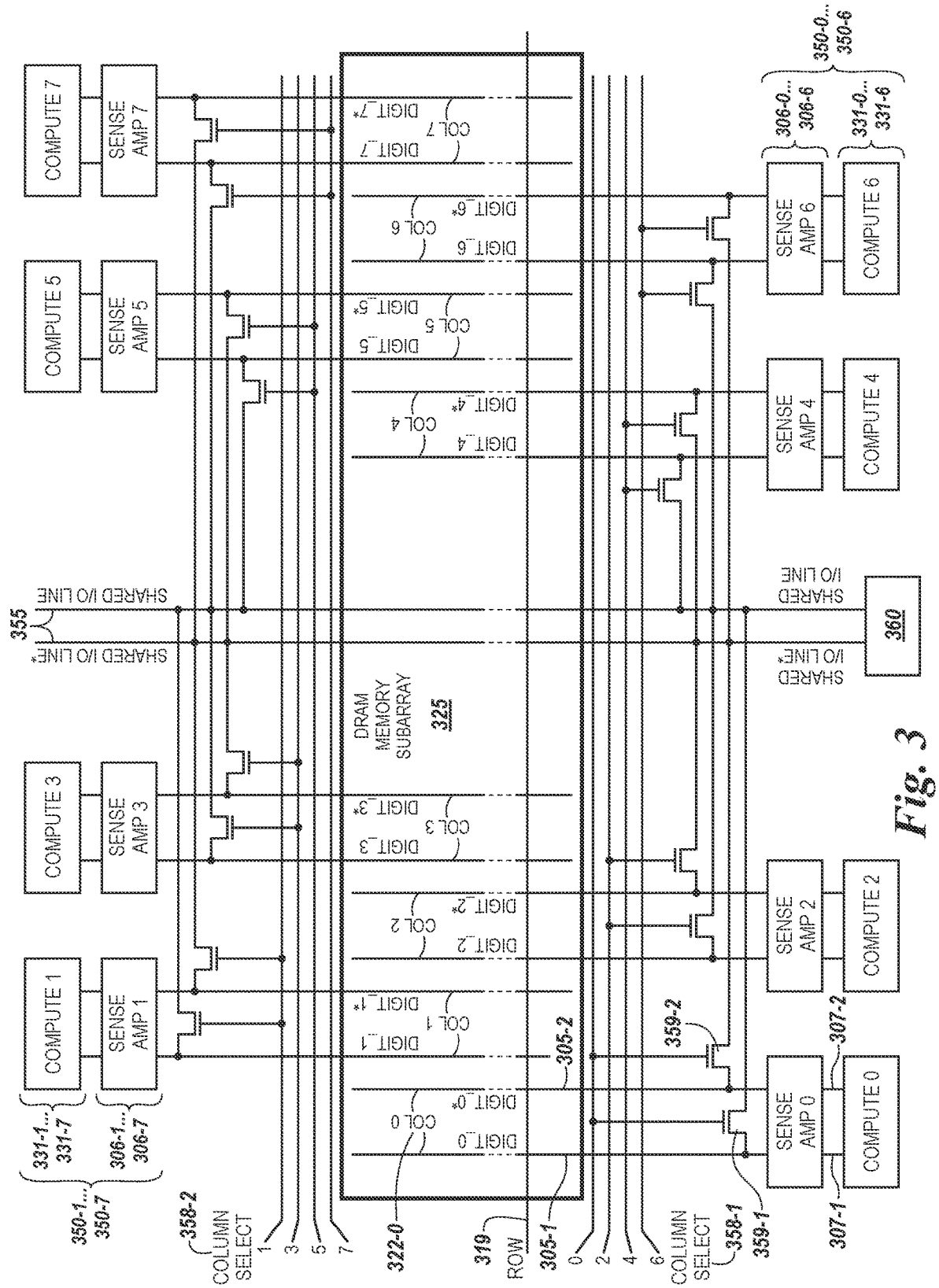
FIG. 3 is a schematic diagram illustrating circuitry for a plurality of shared I/O lines in a data path of an array in accordance with a number of embodiments of the present disclosure.

The present disclosure describes, in some embodiments, that when a row is sensed, the data values in the row (e.g., the data values from all 16,384 (16K) memory cells in the row) may be moved to be stored (e.g., cached) in a latch component (e.g., a sense amplifier) to be further moved on a shared I/O line to a logic stripe in a compute unit in the data path of the shared I/O that is local to the array. In some embodiments, 2048 (2K) shared I/O lines may be configured as a 2K bit wide shared I/O line. According to some embodiments, a number of cycles for moving the data from a first row in a source location to a logic stripe in a destination location may be determined by dividing a number of columns in the array intersected by a row of memory cells in the array by the 2K bit width of the plurality of shared I/O lines. For example, an array (e.g., a bank, a bank section, or a subarray thereof) may have 16K columns, which may correspond to 16K data values in a row, which when divided by the 2K bit width of the plurality of shared I/O lines intersecting the row may yield eight cycles, each separate cycle being at substantially the same point in time (e.g., in parallel) for movement of each 2K bit fraction of the data in the row such that all 16K data bits in the row are moved after completion of the eight cycles. For example, only one of a plurality (e.g., a subset of eight, as shown in FIG. 3) of the sense amplifiers 306 or the compute components 331 in the sensing circuitry 350 of the source location may be coupled at a time to a respective shared I/O line 355. In embodiments having 16K shared I/O lines, all 16K data bits may be moved in parallel.

In one example, 2K data values may be multiplexed at a time (e.g., in parallel) through 2K shared I/O lines from 2K sense amplifiers of the 16K columns (e.g., digit line pairs) by an eight way multiplexer to 2K compute components (e.g., to store and/or process a total of 2K bits) in each logic stripe (e.g., each logic stipe having 2K sensing circuitry units) of a compute unit. In some embodiments, the compute unit may have eight logic stripes to store 2K data values per logic stripe, thereby being capable of storing 16K data values per compute unit that have been moved in eight cycles by the 2K shared I/O lines. In another example, 1K data values may be multiplexed at a time through 1K shared I/O lines from 1K sense amplifiers of the 16K columns by a sixteen way multiplexer to 1K sensing circuitry units (e.g., to store and/or process a total of 1K bits) in a logic stripe (e.g., each logic stipe having 1K sensing circuitry units) of a compute unit. In some embodiments, the compute unit (e.g., as shown at 460 and described in connection with FIG. 4) may have sixteen (16) logic stripes to store 1K data values per logic stripe, thereby being capable of storing 16K data values per compute unit that have been moved in 16 cycles by the 1K shared I/O lines. For example, each of the 16 logic stripes (e.g., shown at 424-1, 424-2, . . . , 424-N and described in connection with FIG. 4) and the 1K sensing circuitry units (e.g., shown at 450-1, 450-2, . . . , 450-Z and described in connection with FIG. 4) in each logic stripe may correspond to a subrow (e.g., shown at 428-1, 428-2, . . . , 424-16 and described in connection with FIG. 4) from which 1K data values are moved (e.g., multiplexed) through respective 1K shared I/O lines.

As such, the memory cells in the bank, the subarray, the row, and/or the subrow from which the data values were moved may be available to perform operations on other data values stored therein (e.g., by having the original data values moved to a logic stripe in the compute unit in the data path of the shared I/O that is local to the array). In various embodiments, each logic stripe may include a number of a plurality of latches, corresponding to (e.g., the same as or an integer multiple of) the number of sensing circuitry units, to store a plurality of data values moved from another bank, subarray, row, and/or subrow to enable performance of a number of operations (e.g., logical operations) on the data values stored by the latches associated with the sensing circuitry units.

As used herein, data movement is an inclusive term that includes, for instance, copying, transferring, and/or transporting data values from a source location to a destination location. Data can, for example, be moved from a sense amplifier, compute component, and/or latch of sensing circuitry of a subarray to a sense amplifier, compute component, and/or latch in a logic stripe in a data path of a shared I/O line local to the array. Copying the data values may indicate that the data values stored (cached) in the sense amplifiers are copied and moved to a logic stripe in the data path of the shared I/O line local to the array and that the original data values stored in the subrow of the row may remain unchanged. Transferring the data values may indicate that the data values stored (cached) in the sense amplifiers are copied and moved to a logic stripe in the data path of the shared I/O line local to the array and that at least one of the original data values stored in the subrow of the row may be changed (e.g., by being erased and/or by a subsequent write operation, as described herein). Transporting the data values may be used to indicate the process by which the copied and/or transferred data values are moved (e.g., by the data values being placed on the shared I/O line from the source location and transported to the destination location).

Implementations of DRAM architecture for in data path compute operations may perform processing at the sense amplifier and compute component level (e.g., in a logic stripe). Implementations of the DRAM architecture for in data path compute operations may allow only a finite number of memory cells to be connected to the compute components in a logic stripe in the data path of the shared I/O lines (e.g., 1K memory cells as given in one example above). An array may include from around 8K to around 16K columns (pairs of digit lines) and associated sense amplifiers. In some embodiments, for example as shown in FIG. 4, a bank section 423 of an array may be divided into four quadrants and each quadrant may have a plurality of subarrays (e.g., 32 subarrays). Each subarray may have a plurality of rows (e.g., 512 rows) and may be coupled to 16K columns. Each row may, as described herein, may include 16 subrows each having 1K memory cells (e.g., selection of which memory cells constitute the 1K coupled to particular shared I/O lines via sensing circuitry being determined by multiplexing). Embodiments, however, are not limited to this illustrative example.

In some embodiments, a plurality of logic stripes as part of a compute unit may be associated with each quadrant. For example each logic stripe in a compute unit in the data path of the shared I/O lines may be associated with a subarray in each quadrant of a bank. Thus, in the above example, a compute unit in the data path of the shared I/O lines local to the array may have 128 logic stripes (4 quadrants, one logic stripe for each of 32 subarrays per quadrant). Embodiments, however, are not limited to this illustrative example. A bank of memory (e.g., of memory cells in a DRAM array) may, in some embodiments, include 64K rows by 16K columns of DRAM to provide around 1 gigabit of memory.

The present disclosure describes a logic stripe in a data path of a shared I/O line local to an array that may include a plurality of latches that function as sense amplifiers to store (cache) data values moved (e.g., copied, transferred, and/or transported) from sensing circuitry associated with the array. The compute components may be in a plurality of logic stripes in a compute unit in the data path of a plurality of shared I/O lines local to the array such that the plurality of logic stripes each includes a subset of a total number of compute components. The compute components 431-1, . . . , 431-Z of logic stripes 424-1, . . . , 424-N (e.g., as shown and described in connection with FIG. 4) may have a pitch equal to the pitch of the data path of the plurality of shared I/O lines 455 local to a bank 121-1 of the array. In some embodiments, the pitch of the data path of the plurality of shared I/O lines 455 may be a function of a pitch of the digit lines of an array of memory cells (e.g., as shown at 205-1 and 205-2 in FIGS. 2 and 305-1 and 305-2 in FIG. 3). The compute components 431-1, . . . , 431-Z and/or logic stripes 424-1, . . . , 424-N may be coupled to the data path of the plurality of shared I/O lines 455 by sensing circuitry 150 (e.g., sense amplifiers 206 of the sensing circuitry) and/or additional latches 170, as shown in FIG. 1A.

Figure 2:
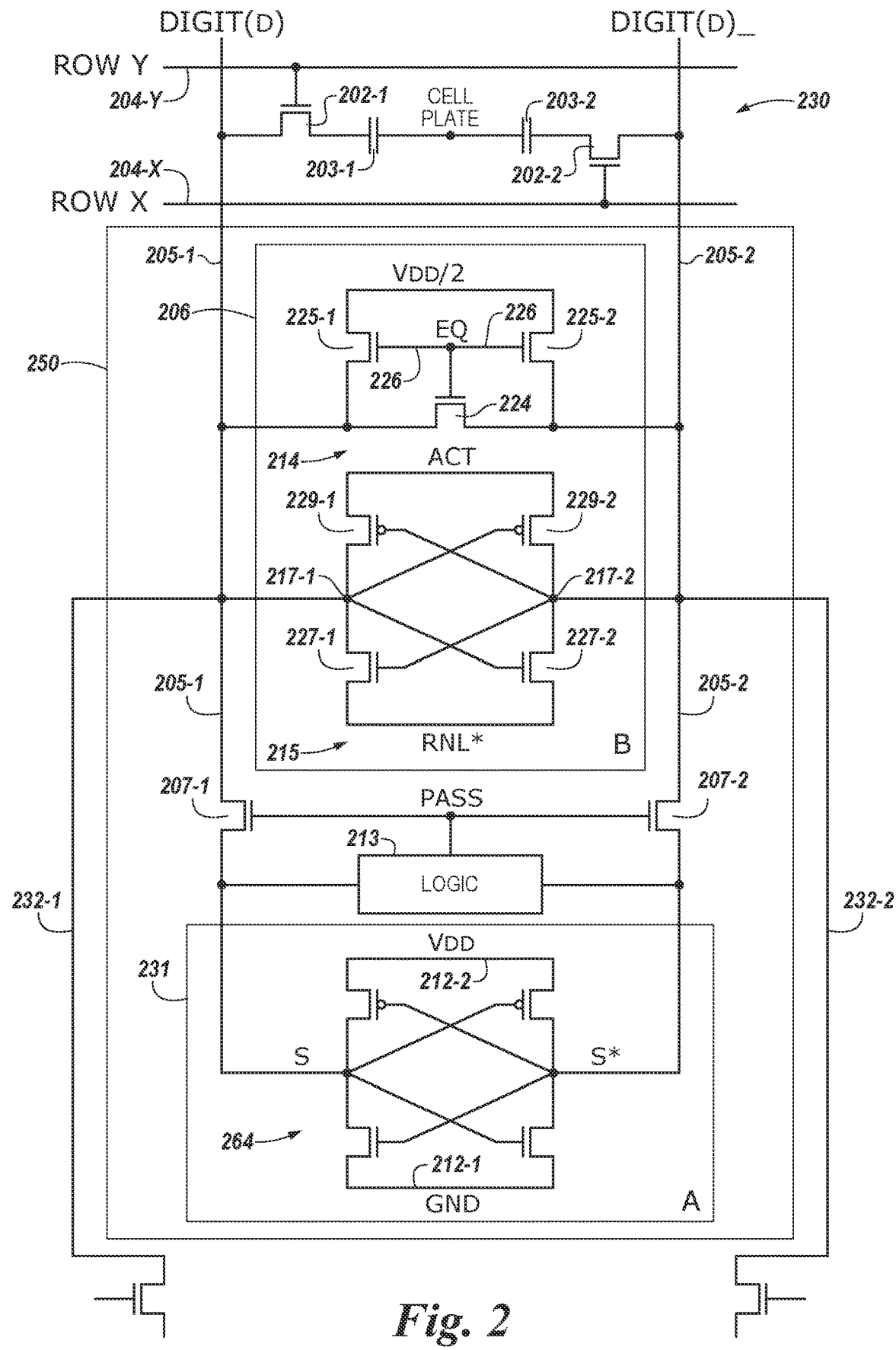
FIG. 2 is a schematic diagram illustrating circuitry of a memory device, the circuitry including a sense amplifier and a compute component, which may be included in sensing circuitry and/or logic stripes, in accordance with a number of embodiments of the present disclosure.

As such, the architecture for in data path compute operations may facilitate movement (e.g., copying, transferring, and/or transporting) of data values stored in a subrow of a row of an array to the sensing circuitry units 450-1, . . . , 450-Z of logic stripes 424-1, . . . , 424-N in the data path of the plurality of shared I/O lines local to the array. Sensing circuitry 150 having sense amplifiers, which in some embodiments may also include compute components as shown in FIG. 2, may couple the memory cells from a multiplexed column of memory cells in an array to the sensing circuitry units 450-1, . . . , 450-Z of logic stripes 424-1, . . . , 424-N in a compute unit in the data path of the plurality of shared I/O lines 455. In this manner, the sensing circuitry units 450-1, . . . , 450-Z of logic stripes 424-1, . . . , 424-N may be indirectly coupled to the memory cells of a column through the plurality of shared I/O lines 455 via column select circuitry operating as a multiplexer (e.g., as shown at 358 and described in connection with FIG. 3) and associated select logic (as discussed in connection with FIGS. 3-7).

The memory array architecture described herein may provide a number of benefits in addition to those just described. Overall processing speed may be increased by, for example, enabling PIM operations to be performed on data stored by memory cells in parallel with performance of other operations (e.g., performance of DDR4 I/O operations). For example, PIM operations may be performed in a compute unit having sensing circuitry units 450-1, . . . , 450-Z of logic stripes 424-1, . . . , 424-N in the data path of the shared I/O lines 455 local to the array. By way of example and not by way of limitation, once data values are loaded to the sensing circuitry units 450-1, . . . , 450-Z of logic stripes 424-1, . . . , 424-N in the compute unit from the subrows of the array, compute operations may be controlled in the compute unit at speeds of 2 ns without having to move the data values back into the rows, as compared to an example time required to fire the rows in the array of 60 ns. In this manner, the sensing circuitry units 450-1, . . . , 450-Z of logic stripes 424-1, . . . , 424-N (along with associated latches) may provide storage of the moved data values for performance of certain functions (e.g., AND, OR, NOR, XOR, add, subtract, multiply, divide, etc.) while the original data values of a subrow may be saved back to a row, saved elsewhere, and/or written over. As discussed more in connection with FIGS. 5 and 6 the operations of the sensing circuitry units 450-1, . . . , 450-Z of logic stripes 424-1, . . . , 424-N in the compute unit in the data path of the plurality of shared I/O lines may be directed by a controller 140 of a bank 121.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "Z", "N", "M", etc., particularly with respect to reference numerals in the drawings, indicate that a number of the particular feature so designated may be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to and/or being able to in at least some embodiments described herein), not in a mandatory sense (i.e., must). The term "include," and derivations thereof, means "including, but not limited to". The terms "couple", "coupled", and "coupling" mean to be directly or indirectly connected physically or for access to and movement (transmission) of commands and/or data, as appropriate to the context. The terms "data" and "data values" are used interchangeably herein and can have the same meaning, as appropriate to the context.

As described herein, the plurality of shared I/O lines 455 may be selectably shared by a plurality of subarrays, bank sections, quadrants, rows, subrows, and/or particular columns of memory cells via select logic coupled to each array. For example, the sensing circuitry 150 and/or additional latches 170, including a sense amplifier and select logic for multiplexing each of a selectable number of subsets of a number of columns (e.g., 8, 16, etc., column subsets of a total number of columns) may be selectably coupled to each of the plurality of shared I/O lines 455 for data values to be moved to the sensing circuitry units 450-1, . . . , 450-Z of logic stripes 424-1, . . . , 424-N in a compute unit 460 in a data path of the plurality of shared I/O lines 455. In some embodiments, the sensing circuitry units 450-1, . . . , 450-Z of logic stripes 424-1, . . . , 424-N selectably coupled to each of the plurality of shared I/O lines 455 may correspond to the number of columns selectably coupled to the plurality of shared I/O lines (e.g., 1K, 2K, etc.). Because the singular forms "a", "an", and "the" can include both singular and plural referents herein, "a shared I/O line" can be used to refer to "a pair of complementary shared I/O lines", unless the context clearly dictates otherwise. Moreover, "shared I/O lines" is an abbreviation of "plurality of shared I/O lines".

The figures herein follow a numbering convention in which the first digit or digits correspond to the figure number and the remaining digits identify an element or component in the figure. Similar elements or components between different figures may be identified by the use of similar digits. For example, 150 may reference element "50" in FIG. 1A, and a similar element may be referenced as 250 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 which includes a memory array 130 in accordance with a number of embodiments of the present disclosure. As used herein, a memory device 120, controller 140, memory array 130, sensing circuitry 150, and/or a number of additional latches 170 might also be separately considered an "apparatus."

Figure 1B:
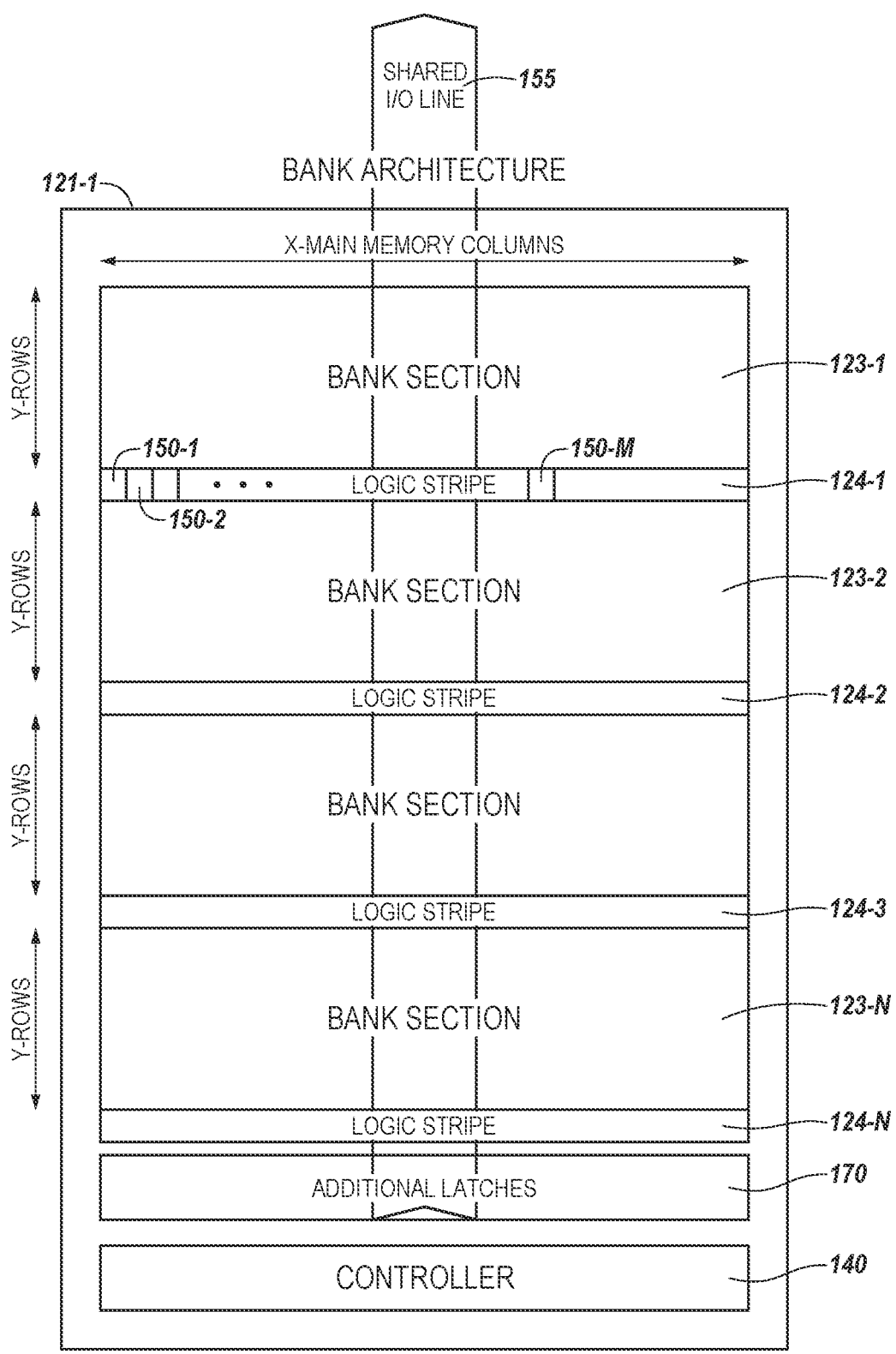
FIG. 1B is another block diagram of an apparatus in the form of a computing system including a memory device having a shared input/out (I/O) line in a data path local to bank sections of an array in accordance with a number of embodiments of the present disclosure.

As used herein, the additional latches are intended to mean additional functionalities (e.g., amplifiers, select logic) that sense, couple, and/or move (e.g., read, store, cache) data values of memory cells in an array and that are distinct from the sensing circuitry units 450-1, . . . , 450-Z of logic stripes 424-1, . . . , 424-N in a compute unit 460 in a data path of the plurality of shared I/O lines 455 shown in FIGS. 3-4 and 6-7. The logic stripes 124-1, . . . , 124-N in a data path of a plurality of shared I/O lines 155 local to the array, as shown in FIG. 1B, may be associated with various bank sections 123-1, . . . , 123-N of memory cells in the bank 121-1. The bank 121-1 may be one of a plurality of banks on the memory device 120.

System 100 in FIG. 1A includes a host 110 coupled (e.g., connected) to the memory device 120. Host 110 may be a host system such as a personal laptop computer, a desktop computer, a digital camera, a smart phone, or a memory card reader, among various other types of hosts. Host 110 may include a system motherboard and/or backplane and may include a number of processing resources (e.g., one or more processors, microprocessors, or some other type of controlling circuitry). The system 100 may include separate integrated circuits or both the host 110 and the memory device 120 may be on the same integrated circuit. The system 100 may be, for instance, a server system and/or a high performance computing (HPC) system and/or a portion thereof. Although the examples shown in FIG. 1A illustrates a system having a Von Neumann architecture, embodiments of the present disclosure may be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 may be a DRAM array, SRAM array, STT RAM array, PCRAM array, TRAM array, RRAM array, NAND flash array, and/or NOR flash array, among other types of arrays. The array 130 may include memory cells arranged in rows coupled by access lines (which may be referred to herein as word lines or select lines) and columns coupled by sense lines (which may be referred to herein as data lines or digit lines). Although a single array 130 is shown in FIG. 1A, embodiments are not so limited. For instance, memory device 120 may include a number of arrays 130 (e.g., a number of banks of DRAM cells, NAND flash cells, etc.).

The memory device 120 may include address circuitry 142 to latch address signals provided over a data bus 156 (e.g., an I/O bus connected to the host 110) by I/O circuitry 144 (e.g., provided to external ALU circuitry and/or to DRAM DQs via local I/O lines and global I/O lines). As used herein, DRAM DQs may enable input of data to and/or output of data from a bank (e.g., from and/or to the controller 140 and/or host 110) via a bus (e.g., data bus 156). During a write operation, a voltage (high=1, low=0) may be applied to a DQ (e.g., a pin). This voltage may be translated into an appropriate signal and stored by a selected memory cell. During a read operation, a data value read from a selected memory cell may appear at the DQ once access is complete and the output is enabled (e.g., by the output enable signal being low). At other times, DQs may be in a high impedance state, such that the DQs do not source or sink current and do not present a signal to the system. This also may reduce DQ contention when two or more devices (e.g., banks) share a combined data bus, as described herein. Such DQs are separate and distinct from the plurality of shared I/O lines 155 (in FIG. 1B) in a data path local to the array 130.

Status and exception information may be provided from the controller 140 of the memory device 120 to a channel controller 143, for example, through an out-of-band (OOB) bus 157 (e.g., high-speed interface (HSI)), which in turn may be provided from the channel controller 143 to the host 110. The channel controller 143 may include a logic component to allocate a plurality of locations (e.g., controllers for subarrays) in the arrays of each respective bank to store bank commands, application instructions (e.g., for sequences of operations), and arguments (PIM commands) for various banks associated with operations for each of a plurality of memory devices 120. The channel controller 143 may dispatch commands (e.g., PIM commands) to the plurality of memory devices 120 to store those program instructions within a given bank 121 (e.g., 121-1 of FIG. 1B) of a memory device 120.

Address signals are received through address circuitry 142 and decoded by a row decoder 146 and a column decoder 152 to access the memory array 130. Data may be sensed (read) from memory array 130 by sensing voltage and/or current changes on sense lines (digit lines) using a number of sense amplifiers, as described herein, of the sensing circuitry 150. A sense amplifier may read and latch a page (e.g., a row) of data from the memory array 130. Additional compute circuitry, as described herein, may be coupled to the sensing circuitry 150 and may be used in combination with the sense amplifiers to sense, store (e.g., cache and/or buffer), perform compute functions (e.g., operations), and/or move data. The I/O circuitry 144 may be used for bi-directional data communication with host 110 over the data bus 156 (e.g., a 64 bit wide data bus). The write circuitry 148 may be used to write data to the memory array 130.

Figure 5:
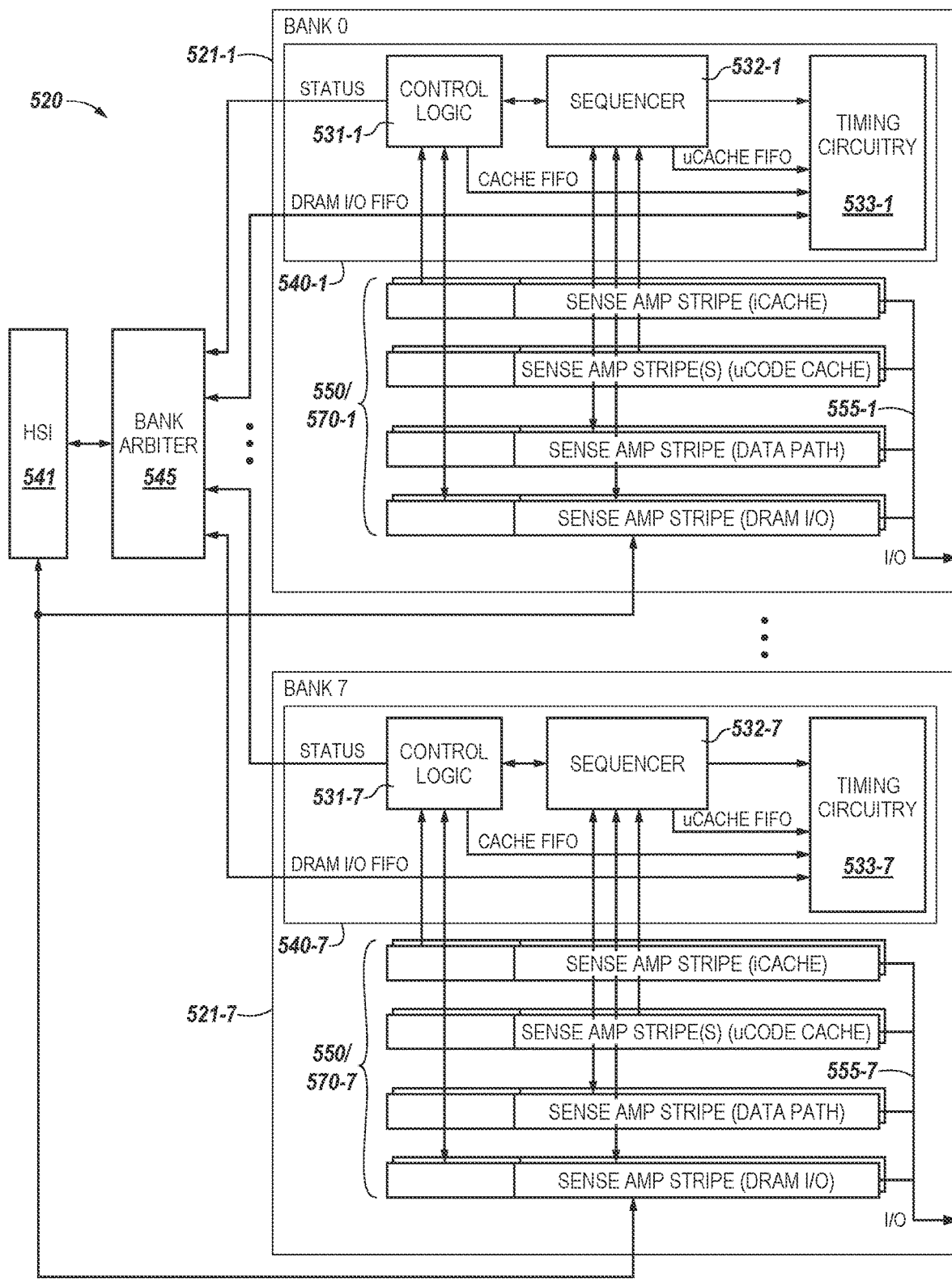
FIG. 5 is a block diagram illustrating an example of a controller of a memory device in accordance with a number of embodiments of the present disclosure.

Controller 140 (e.g., bank control logic, sequencer and timing circuitry shown in FIG. 5) may decode signals (e.g., commands) provided by control bus 154 from the host 110. These signals may include chip enable signals, write enable signals, and/or address latch signals that may be used to control operations performed on the memory array 130, including data sense, data store, data movement (e.g., copying, transferring, and/or transporting data values), data write, and/or data erase operations, among other operations. In various embodiments, the controller 140 may be responsible for executing instructions from the host 110 and/or accessing the memory array 130. The controller 140 may be a state machine, a sequencer, or some other type of controller. The controller 140 may control shifting data (e.g., right or left) in a row of an array (e.g., memory array 130) and execute microcode instructions to perform operations such as compute operations (e.g., AND, OR, NOR, XOR, add, subtract, multiply, divide, etc.).

Examples of the sensing circuitry 150 are described further below (e.g., in FIGS. 2 and 3). For instance, in some embodiments, the sensing circuitry 150 may include a number of sense amplifiers. In some embodiments, the sensing circuitry 150 may include the number of sense amplifiers and a corresponding number of compute components, which may serve as an accumulator and may be used to perform operations in each subarray (e.g., on data associated with complementary sense lines) in addition to the in data path compute operations described herein.

In some embodiments, the sensing circuitry 150 may be used to perform operations using data stored by memory array 130 as inputs and participate in movement of the data for copy, transfer, transport, writing, logic, and/or storage operations to a different location in the memory array 130 and/or in logic stripes 124 without transferring the data via a sense line address access (e.g., without firing a column decode signal). As such, in some embodiments, various compute functions may be performed using, and within, sensing circuitry 150 rather than (or in association with) being performed by processing resources external to the sensing circuitry 150 (e.g., by a processor associated with host 110 and/or other processing circuitry, such as ALU circuitry, located on device 120, such as on controller 140 or elsewhere). However, in addition, embodiments described herein may perform in data path compute functions and/or operations on data values moved to a plurality of compute components 431-1, . . . , 431-Z and/or logic stripes 124-1, . . . , 124-N in a compute unit from the rows of the array. And as an example, according to some embodiments, compute operations may be controlled in the compute unit at speeds of 2 ns without having to move the data values back into the rows, as compared to an example time required to fire the rows in the array of 60 ns.

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O circuitry 144.

In contrast, embodiments herein perform compute functions on data values, moved to a plurality of sensing circuitry units 450-1, . . . , 450-Z of logic stripes 424-1, . . . , 424-N via a plurality of shared I/O lines 155 from the rows and/or subrows of the array, in a compute unit in a data path local to the array. Additionally, sensing circuitry 150 may be configured to perform operations on data stored by memory array 130 and store the result back to the memory array 130 without enabling an I/O line (e.g., a local I/O line) coupled to the sensing circuitry 150. However, once loaded, compute operations may be controlled in the compute unit much faster (e.g., at speeds of 2 ns) without having to move the data values back into the rows and/or subrows, as compared to an example time required to fire the rows in the array (e.g., 60 ns). The sensing circuitry 150 may be formed on pitch with the memory cells of the array. The plurality of sensing circuitry units 450-1, . . . , 450-Z of logic stripes 424-1, . . . , 424-N, associated with the data path of the plurality of shared I/O lines 155, may have a pitch equal to that of the data path and that is a function of a pitch of digit lines to the array of memory cells For example, the sensing circuitry 150 described herein may be formed on a same pitch as a pair of complementary sense lines (e.g., digit lines). As an example, a pair of complementary memory cells may have a cell size with a $6F^2$ pitch (e.g., 3F×2F), where F is a feature size. If the pitch of a pair of complementary sense lines for the complementary memory cells is 3F, then the sensing circuitry being on pitch indicates the sensing circuitry (e.g., a sense amplifier and/or a corresponding compute component per respective pair of complementary sense lines) is formed to fit within the 3F pitch of the complementary sense lines. Likewise, the compute components 431-1, . . . , 431-Z of the logic stripes 124-1, . . . , 124-N, associated with the data path of the plurality of shared I/O lines 155, have a pitch that is a function of the 3F pitch of the complementary sense lines. For example, the compute components 431-1, . . . , 431-Z of logic stripes 124-1, . . . , 124-N may have a pitch that is an integer multiple of the 3F pitch of digit lines to the array of memory cells, which also may correspond to a pitch of the plurality of shared I/O lines 155.

By contrast, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which may affect chip size and/or memory density, for example. In the context of some computing systems and subsystems (e.g., a central processing unit (CPU)), data may be processed in a location that is not on pitch and/or on chip with memory (e.g., memory cells in the array), as described herein. For example, the data may be processed by a processing resource associated with a host, for instance, rather than on pitch with the memory.

As such, in a number of embodiments, circuitry external to array 130 and sensing circuitry 150 is not needed to perform compute functions as the sensing circuitry 150 may perform the appropriate operations to perform such compute functions or may perform such operations in a data path of a plurality of shared I/O lines local to the array without the use of an external processing resource. Therefore, the sensing circuitry 150 and/or the plurality of sensing circuitry units 450-1, . . . , 450-Z of logic stripes 424-1, . . . , 424-N in a compute unit in a data path of the plurality of shared I/O lines 155 may be used to complement or to replace, at least to some extent, such an external processing resource (or at least the bandwidth consumption of such an external processing resource). In some embodiments, the sensing circuitry 150 and/or the plurality of sensing circuitry units 450-1, . . . , 450-Z of logic stripes 424-1, . . . , 424-N in a compute unit in a data path of the plurality of shared I/O lines 155 may be used to perform operations (e.g., to execute instructions) in addition to operations performed by an external processing resource (e.g., host 110). For instance, host 110 and/or sensing circuitry 150 may be limited to performing only certain operations and/or a certain number of operations.

Operations described herein may include operations associated with a PIM capable device. PIM capable device operations may use bit vector based operations. As used herein, the term "bit vector" is intended to mean a number of bits on a bit vector memory device (e.g., a PIM device) stored physically contiguously or non-contiguously in a row of an array of memory cells. Thus, as used herein a "bit vector operation" is intended to mean an operation that is performed on a bit vector that is a contiguous or non-contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K sense amplifiers 206 and/or processing elements (e.g., compute components 231) formed on pitch with the sense lines selectably coupled to corresponding memory cells in the 16 bit row. A compute component in the sensing circuitry and/or logic stripe of the PIM device may operate as a one bit processing element (PE) on a single bit of the bit vector of the row or subrow of memory cells sensed by the sensing circuitry 150 (e.g., sensed by and/or stored by a sense amplifier, as described herein). Similarly, the plurality sensing circuitry units 450-1, . . . , 450-Z of logic stripes 424-1, . . . , 424-N in a compute unit in a data path of the plurality of shared I/O lines 155 may each operate as a one bit PE on a single bit of the bit vector of the row and/or subrow of memory cells sensed in an array.

Enabling an I/O line may include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) may be used to perform operations without enabling column decode lines of the array.

However, the plurality of shared I/O lines 155 may be enabled in order to load data values to the plurality of sensing circuitry units 450-1, . . . , 450-Z of logic stripes 424-1, . . . , 424-N in a compute unit in a data path of the plurality of shared I/O lines 155 where compute operations may be controlled much faster. For example, in the plurality of sensing circuitry units 450-1, . . . , 450-Z of logic stripes 424-1, . . . , 424-N in the compute unit, the compute operation may be performed at speeds of 2 ns. This enhancement of speed may be attributed to not having to move the data values back into the rows and/or subrows with the associated time used in firing the rows in the array (e.g., 60 ns).

FIG. 1B is another block diagram of an apparatus in the form of a computing system including a memory device having a I/O line 155 in a data path local to bank sections 123-1, 123-2, . . . , 123-N of an array in accordance with a number of embodiments of the present disclosure. For example, bank 121-1 may represent an example bank of a memory device 120. As shown in FIG. 1B, a bank 121-1 may include a plurality of main memory columns (shown horizontally as X) (e.g., 16,384 columns in an example DRAM bank). Additionally, the bank 121-1 may be divided up into bank sections (e.g., quadrants of 32 subarrays), 123-1, 123-2, . . . , 123-N. Each bank section may be associated with a plurality of sensing circuitry units 450-1, . . . , 450-Z of logic stripes 424-1, . . . , 424-N in a compute unit in a data path of the plurality of shared I/O lines 155. Each of the of the bank sections 123-1, . . . , 123-N may include a plurality of rows (shown vertically as Y) (e.g., each section may be a quadrant that includes 32 subarrays that each may include 512 rows and 16 subrows per row in an example DRAM bank). Example embodiments are not limited to the example horizontal and/or vertical orientation of columns and rows and subrows described here or the example numbers thereof.

Each bank section, in some embodiments, may have a plurality of sensing circuitry units 450-1, . . . , 450-Z of logic stripes 424-1, . . . , 424-N in a compute unit in a data path of the plurality of shared I/O lines 155 associated therewith. The bank 121-1 may include a controller 140 and/or a number of controllers associated with each bank section and/or subarray to direct movement (e.g., via movement component 171) and/or operations on data values loaded to the plurality of sensing circuitry units 450-1, . . . , 450-Z of logic stripes 424-1, . . . , 424-N in a compute unit in a data path of the plurality of shared I/O lines 155.

FIG. 2 is a schematic diagram illustrating circuitry of a memory device 120, the circuitry including a sense amplifier 206 and a compute component 231, which each may, in various embodiments, be included in sensing circuitry 250 and/or logic stripes 124, in accordance with a number of embodiments of the present disclosure. The sensing circuitry 250 may correspond to sensing circuitry 150 shown in FIG. 1A.

As shown in the example embodiment of FIG. 2, a memory cell may include a storage element (e.g., capacitor) and an access device (e.g., transistor). For example, a first memory cell may include transistor 202-1 and capacitor 203-1, and a second memory cell may include transistor 202-2 and capacitor 203-2, etc. In this embodiment, the memory array 230 is a DRAM array of 1T1B (one transistor one capacitor) memory cells, although other embodiments of configurations may be used (e.g., 2T2C with two transistors and two capacitors per memory cell). In a number of embodiments, the memory cells may be destructive read memory cells (e.g., reading the data stored by the cell destroys the data such that the data originally stored by the cell is refreshed after being read).

The cells of the memory array 230 may be arranged in rows coupled by access (word) lines 204-X (Row X), 204-Y (Row Y), etc., and columns coupled by pairs of complementary sense lines (e.g., digit lines DIGIT(D) and DIGIT (D)_ shown in FIG. 2). The individual sense lines corresponding to each pair of complementary sense lines may also be referred to as digit lines 205-1 for DIGIT (D) and 205-2 for DIGIT (D)_, respectively, or corresponding reference numbers in FIG. 3. Although only one pair of complementary digit lines are shown in FIG. 2, embodiments of the present disclosure are not so limited, and an array of memory cells may include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells may be coupled to different digit lines and word lines. For example, a first source/drain region of a transistor 202-1 may be coupled to digit line 205-1 (D), a second source/drain region of transistor 202-1 may be coupled to capacitor 203-1, and a gate of a transistor 202-1 may be coupled to word line 204-Y. A first source/drain region of a transistor 202-2 may be coupled to digit line 205-2 (D)_, a second source/drain region of transistor 202-2 may be coupled to capacitor 203-2, and a gate of a transistor 202-2 may be coupled to word line 204-X. A cell plate, as shown in FIG. 2, may be coupled to each of capacitors 203-1 and 203-2. The cell plate may be a common node to which a reference voltage (e.g., ground) may be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). However, in some embodiments, the sensing circuitry 250 used for in data path compute operations performed by compute components of logic stripes may not include compute components in the sensing circuitry 250. The sense amplifier 206 may be coupled to the pair of complementary digit lines 205-1 and 205-2. If present, the compute component 231 may be coupled to the sense amplifier 206 via pass gates 207-1 and 207-2. The gates of the pass gates 207-1 and 207-2 may be coupled to operation selection logic 213.

The operation selection logic 213 may be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 may also be coupled to the pair of complementary digit lines 205-1 and 205-2. The operation selection logic 213 may be configured to control continuity of pass gates 207-1 and 207-2 based on a selected operation.

The sense amplifier 206 may be operated to determine a data value (e.g., logic state) stored by a selected memory cell. The sense amplifier 206 may comprise a cross coupled latch, which may be referred to herein as a primary latch. In the example illustrated in FIG. 2, the circuitry corresponding to sense amplifier 206 comprises a latch 215 including four transistors coupled to a pair of complementary digit lines D 205-1 and (D)_ 205-2. However, embodiments are not limited to this example. The latch 215 may be a cross coupled latch (e.g., gates of a pair of transistors) such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 may be referred to as the primary latch.

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal may be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell.

Embodiments are not limited to the sense amplifier 206 configuration illustrated in FIG. 2. As an example, the sense amplifier 206 may be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation may be stored back to the array without transferring the data via a digit line address access (e.g., without firing a column decode signal such that data is transferred to circuitry external from the array and sensing circuitry via local I/O lines). As such, a number of embodiments of the present disclosure may enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments may enable an increased (e.g., faster) processing capability as compared to previous approaches.

The sense amplifier 206 may further include equilibration circuitry 214, which may be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 may be coupled digit line 205-1 (D), and a second source/drain region of transistor 225-2 may be coupled digit line 205-2 (D)_. Gates of transistors 224, 225-1, and 225-2 may be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) may be operated to perform a selected operation and initially store the result in one of the sense amplifier 206 or the compute component 231 without transferring data from the sensing circuitry via a local or global I/O line (e.g., without performing a sense line address access via activation of a column decode signal, for instance).

Figure 4:
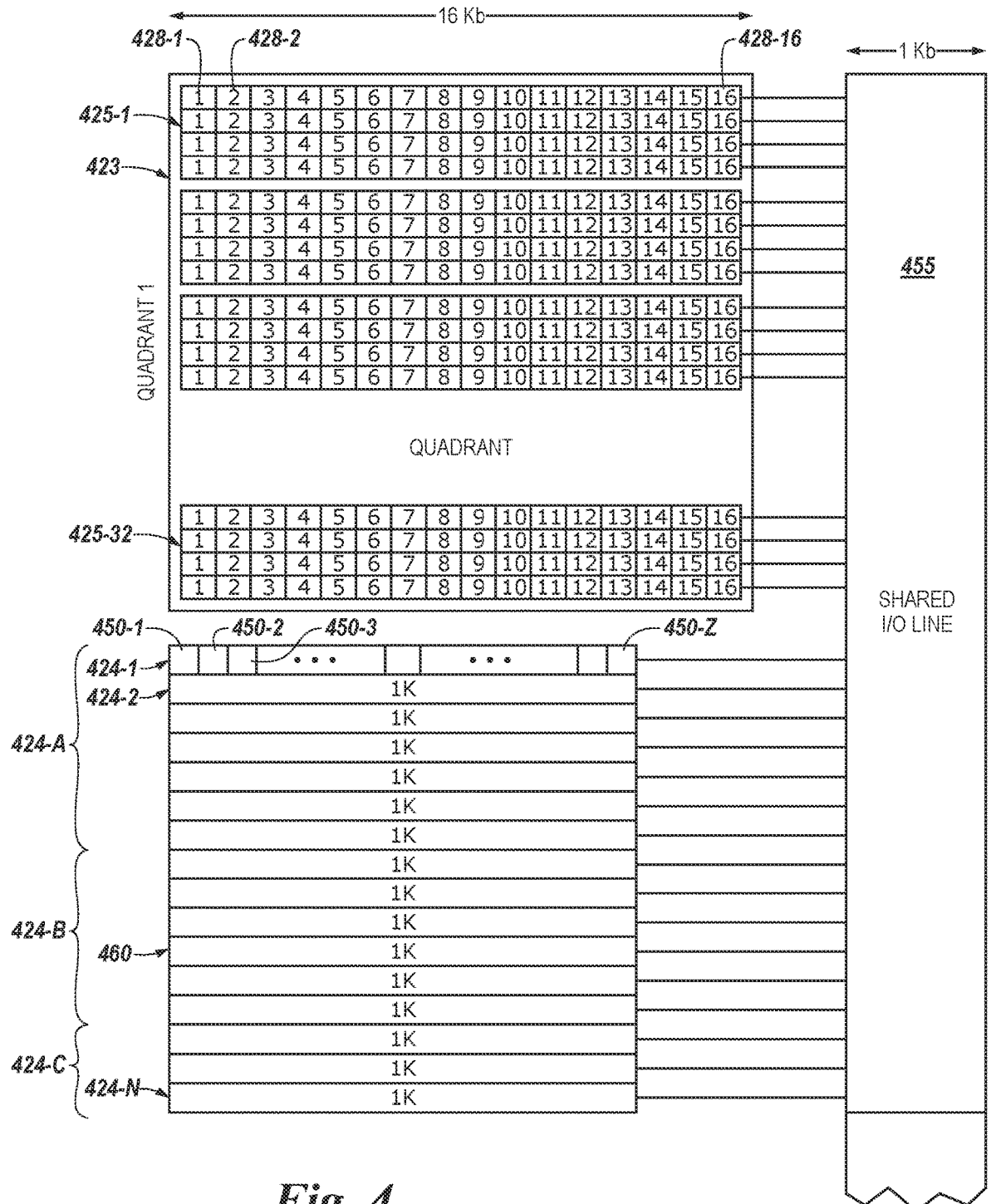
FIG. 4 is a block diagram illustrating a plurality of sections of an array coupled to a compute unit, having a plurality of logic stripes, by a plurality of shared I/O lines in a data path local to the array in accordance with a number of embodiments of the present disclosure.

However, further to embodiments described herein, sensing circuitry 250 having sense amplifiers 206, which in some embodiments may also include compute components 231 as shown in FIG. 2, may also couple the memory cells from a multiplexed column of memory cells in an array to the sensing circuitry units 450-1, . . . , 450-Z of logic stripes 424-1, . . . , 424-N in a compute unit 460 in the data path of the plurality of shared I/O lines 455 local to the array as discussed in connection with FIG. 4. In this manner, the sensing circuitry units 450-1, . . . , 450-Z of logic stripes 424-1, . . . , 424-N may be indirectly coupled to the memory cells of a column through the plurality of shared I/O lines 455 via select logic (discussed in connection with FIGS. 3-7).

Performance of operations (e.g., Boolean logical operations involving data values) is fundamental and commonly used. Boolean logical operations are used in many higher level operations. Consequently, speed and/or power efficiencies that may be realized with improved operations, may translate into speed and/or power efficiencies of higher order functionalities.

As shown in FIG. 2, the compute component 231 may also comprise a latch, which may be referred to herein as a secondary latch 264. The secondary latch 264 may be configured and operated in a manner similar to that described above with respect to the primary latch 215, with the exception that the pair of cross coupled p-channel transistors (e.g., PMOS transistors) included in the secondary latch may have their respective sources coupled to a supply voltage (e.g., $V_{DD}$), and the pair of cross coupled n-channel transistors (e.g., NMOS transistors) of the secondary latch may have their respective sources selectively coupled to a reference voltage (e.g., ground), such that the secondary latch is continuously enabled. The configuration of the compute component 231 is not limited to that shown in FIG. 2, and various other embodiments are feasible, for example, for use as the compute components 431-1, . . . , 431-Z described in connection with logic stripes 424-1, . . . , 424-N of FIG. 4.

As described herein, a memory device (e.g., 120 in FIG. 1A) may be configured to couple to a host (e.g., 110) via a data bus (e.g., 156) and a control bus (e.g., 154). A bank 121 in the memory device 120 may include a plurality of bank sections (123-1, . . . , 123-N in FIG. 1B) of memory cells. The bank 121 may include sensing circuitry (e.g., 150 in FIG. 1A and corresponding reference numbers in FIGS. 2 and 3) coupled to the plurality of arrays via a plurality of columns (FIG. 1B) of the memory cells. The sensing circuitry may include a sense amplifier and/or a compute component (e.g., 206 and 231, respectively, in FIG. 2) coupled to each of the columns.

Each bank section 123 may be associated with a plurality of logic stripes (e.g., 124-0, 124-1, . . . , 124-N−1 in FIG. 1B) in a compute unit in a data path of a plurality of shared I/O lines (155 in FIG. 1B) local to array 230. A controller (e.g., 140 in FIGS. 1A and 1B) coupled to the bank may be configured to direct, as described herein, movement of data values to a compute component 431 (FIG. 4) in a logic stripe 424 (FIG. 4) in a compute unit 360/460 (FIGS. 3 and 4) in a data path of a shared I/O line 355/455 (FIGS. 3 and 4) local to the array 230.

The memory device may include a logic stripe (e.g., 124 in FIG. 1B and 424 in FIG. 4) having a plurality of sensing circuitry units (e.g., 450-1, . . . , 450-Z in FIG. 4) that each may correspond to a number of the plurality of columns (FIG. 1B) of the memory cells in a subrow (e.g., 428-1, . . . , 428-16 in FIG. 4). As discussed further in connection with FIG. 3, the number of sense amplifiers 206 and/or compute components 231 in sensing circuitry 250 may be selectably coupled (e.g., multiplexed via column select circuitry 358-1 and 358-2 in FIG. 3) to a plurality of shared I/O lines 355 (FIG. 3). The column select circuitry may be configured to selectably sense data in a particular column of memory cells of an array by being selectably coupled to a plurality of (e.g., four, eight, and sixteen, among other possibilities) sense amplifiers and/or compute components.

In some embodiments, a number of a plurality of logic stripes (e.g., 124-1, . . . , 124-N in FIG. 1B) in a bank may correspond to a number of bank sections 123-1, . . . , 123-N in FIG. 1B (e.g., a quadrant having a plurality of subarrays) in the bank. Alternatively or in addition, the number of the plurality of logic stripes in a bank may correspond to a number of a plurality of subrows in a row of a DRAM array. A logic stripe may include a plurality of sensing circuitry units (e.g., 450-1, . . . , 450-Z in FIG. 4) in a data path of a shared I/O line (e.g., 455 in FIG. 4) to the array 230 that may be configured and/or operate like the sensing circuitry 250 shown in FIG. 2. As will be shown in FIG. 3, data values sensed from a row or subrow of the array may be moved in parallel by column select logic via a plurality of shared I/O lines 355 (FIG. 3) to a plurality of sensing circuitry units 450 (FIG. 4) in a compute unit 360/460 (FIGS. 3 and 4) of a data path of the plurality of shared I/O lines 355/455 (FIGS. 3 and 4). In some embodiments, the amount of data may correspond to a 1K bit width of the plurality of shared I/O lines, which also may correspond the number of memory cells and/or data values of a subrow.

In various embodiments, connection circuitry 232-1 may, for example, be coupled at 217-1 and connection circuitry 232-2 may be coupled at 217-1 to a primary latch 215 (e.g., sense amplifier 206 serving as a latch associated with a compute component 231 in a logic stripe) for movement of sensed, stored, and/or data values of a logic stripe on which an operation has been performed. The data values may be moved to a selected latch and/or compute component 231 in another logic stripe, as described herein, directly (e.g., as a bit serial link) via the connection circuitry 232-1 and 232-2 (e.g., without movement via a shared I/O line).

Although FIG. 2 shows connection circuitry 232-1 and 232-2 to be coupled at 217-1 and 217-2, respectively, of the primary latch 215, embodiments are not so limited. For example, connection circuitry 232-1 and 232-2 may, for example, be coupled to the secondary latch 264 (e.g., compute component 231) for movement of the data values to a selected latch and/or compute component 231 in another logic stripe via the connection circuitry 232-1 and 232-2. For example, such connection circuitry 232-1 and 232-2 may enable (e.g., as directed by controller 140) a cascade of data values (bits) from latches and/or compute components in a first logic stripe to corresponding latches and/or compute components in a second logic stripe (e.g., an adjacent logic stripe) for performance of a systolic sequence of operations in a plurality of logic stripes (e.g., as described in connection with FIGS. 9A-9B).

As described herein, the array of memory cells may include an implementation of DRAM memory cells where the controller is configured, in response to a command, to move (e.g., copy, transfer, and/or transport) data from the source location to the destination location via a shared I/O line. In various embodiments, the source location may be in a first bank and the destination location may be in a compute unit 360 (FIG. 3) in a data path of the shared I/O lines 355 (FIG. 3) local to the array 230.

As described in FIG. 3, the apparatus may be configured to move (e.g., copy, transfer, and/or transport) data from a source location, including a particular row (e.g., 319 in FIG. 3) and column address associated with a first number of sense amplifiers and/or compute components to a shared I/O line (e.g., 355 in FIG. 3). In addition, the apparatus may be configured to move the data to a destination location, including a particular logic stripe 424 (FIG. 4) associated with a compute unit 360 (FIG. 3) in a data path of the shared I/O line 355 (FIG. 3). As the reader will appreciate, each shared I/O line 355 (FIG. 3) may be a single line or may include a pair of complementary shared I/O lines (e.g., shared I/O line and shared I/O line* in FIG. 3). In some embodiments, 2K shared I/O lines (e.g., complementary pairs of shared I/O lines) may be configured as a 2K bit wide shared I/O line. In some embodiments, 1K shared I/O lines (e.g., complementary pairs of shared I/O lines) may be configured as a 1K bit wide shared I/O line.

FIG. 3 is a schematic diagram illustrating circuitry for a plurality of shared I/O lines in a data path of an array in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a respective pair of complementary shared I/O lines 355 (e.g., shared I/O line and shared I/O line*). FIG. 3 also shows eight compute components (e.g., compute components 0, 1, . . . , 7 shown at 331-0, 331-1, . . . , 331-7) each coupled to a respective sense amplifier (e.g., as shown for sense amplifier 0 at 306-0) via respective pass gates 307-1 and 307-2 and digit lines 305-1 and 305-2. The pass gates may be connected as shown in FIG. 2 and may be controlled by an operation selection signal, Pass. For example, an output of the selection logic may be coupled to the gates of the pass gates 307-1 and 307-2 and digit lines 305-1 and 305-2. In some embodiments, corresponding pairs of the sense amplifiers and compute components may contribute to formation of the sensing circuitry indicated at 350-0, 350-1, . . . , 350-7.

Data values present on the pair of complementary digit lines 305-1 and 305-2 may be loaded into the sense amplifier 306-0 as described in connection with FIG. 2. In some embodiments, when the pass gates 307-1 and 307-2 are enabled, data values on the pair of complementary digit lines 305-1 and 305-2 may be passed from the sense amplifiers to the compute component (e.g., 306-0 to 331-0). The data values on the pair of complementary digit lines 305-1 and 305-2 may be the data value stored by the sense amplifier 306-0 when the sense amplifier is fired.

The sense amplifiers 306-0, 306-1, . . . , 306-7 in FIG. 3 may each correspond to sense amplifier 206 shown in FIG. 2. The compute components 331-0, 331-1, . . . , 331-7 shown in FIG. 3 may each correspond to compute component 231 shown in FIG. 2. An individual sense amplifier, or a combination of one sense amplifier with one compute component, may contribute to the sensing circuitry (e.g., 350-0, 350-1, . . . , 350-7) of a portion of a DRAM memory subarray 325 coupled to a shared I/O line 355 shared by a number of logic stripes of compute unit 360 in a data path of the shared I/O lines 355.

The configurations of embodiments illustrated in FIG. 3 are shown for purposes of clarity and are not so limited. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 and/or compute components 331-0, 331-1, . . . , 331-7 of the sensing circuitry being formed above the columns 322 of memory cells (not shown) and half being formed below the columns 322 of memory cells. Nor are the number of such combinations of the sense amplifiers and/or compute components forming the sensing circuitry configured to couple to a shared I/O line limited to eight. For example, the number of sense amplifiers and/or compute components forming the sensing circuitry configured to couple to a shared I/O line may be 16 when the number of subrows per row and/or the number of logic stripes is 16. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and/or compute components forming the sensing circuitry (e.g., rather than being at either end of the combination of the sense amplifiers and the compute components).

The circuitry illustrated in FIG. 3 also shows column select circuitry 358-1 and 358-2 that is configured to implement data movement operations by multiplexing with respect to particular columns 322 of a subarray 325, the complementary digit lines 305-1 and 305-2 associated therewith, and the shared I/O line 355 (e.g., as directed by the controller 140 shown in FIGS. 1A and 1B). For example, column select circuitry 358-1 has select lines 0, 2, 4, and 6 that are configured to couple with corresponding columns, such as column 0 (332-0), column 2, column 4, and column 6. Column select circuitry 358-2 has select lines 1, 3, 5, and 7 that are configured to couple with corresponding columns, such as column 1, column 3, column 5, and column 7. The column select circuitry 358 described in connection with FIG. 3 can, in various embodiments, represent at least a portion of the functionality embodied by and contained in multiplexers (e.g., an 8 way multiplexer, a 16 way multiplexer, etc.).

Controller 140 may be coupled to column select circuitry 358 to control select lines (e.g., select line 0) to access data values stored by the sense amplifiers, compute components, and/or present on the pair of complementary digit lines (e.g., 305-1 and 305-2 when selection transistors 359-1 and 359-2 are activated via signals from select line 0). Activating the selection transistors 359-1 and 359-2 (e.g., as directed by the controller 140) enables coupling of sense amplifier 306-0, compute component 331-0, and/or complementary digit lines 305-1 and 305-2 of column 0 (322-0) to move data values on digit line 0 and digit line 0* to shared I/O line 355. For example, the moved data values may be data values from a particular row 319 stored (cached) in sense amplifier 306-0 and/or compute component 331-0. Data values from each of columns 0 through 7 may similarly be selected by controller 140 activating the appropriate selection transistors.

Moreover, enabling (e.g., activating) the selection transistors (e.g., selection transistors 359-1 and 359-2) may enable a particular sense amplifier and/or compute component (e.g., 306-0 and/or 331-0, respectively) to be coupled with a shared I/O line 355 such that data values stored by an amplifier and/or compute component may be moved to (e.g., placed on and/or transferred to) the shared I/O line 355. In some embodiments, one column at a time is selected (e.g., column 322-0) to be coupled to a particular shared I/O line 355 to move (e.g., copy, transfer, and/or transport) the stored data values. In the example configuration of FIG. 3, the shared I/O line 355 is illustrated as a shared, differential I/O line pair (e.g., shared I/O line and shared I/O line*). Hence, selection of column 0 (322-0) could yield two data values (e.g., two bits with values of 0 and/or 1) from a subrow of a row (e.g., row 319) and/or as stored by the sense amplifier and/or compute component associated with complementary digit lines 305-1 and 305-2. These data values could be input in parallel to each shared, differential I/O pair (e.g., shared I/O and shared I/O*) of the shared differential I/O line 355.

FIG. 4 is a block diagram illustrating a bank section 423 of an array 130 (FIG. 1A) coupled to a compute unit 460, having a plurality of logic stripes, 424-1, . . . , 424-Z, by a plurality of shared I/O lines 455 in a data path local to the array 130 in accordance with a number of embodiments of the present disclosure. In the embodiment of FIG. 4, a bank section 423 (e.g., having a plurality of bank quadrants) is shown having a plurality of subarrays 425-1, . . . , 425-32 per quadrant. In FIG. 4, 32 subarrays are illustrated in bank quadrant 1. However, embodiments are not limited to this example. This example shows a bank section 423 as having 16K columns, which may be multiplexed (e.g., via the column select circuitry shown at 358-1 and 358-2 and described in connection with FIG. 3) by 16 subrows 428-1, . . . , 428-16 per row to the shared I/O lines 455. In some embodiments, every sixteenth column, and a coupled memory cell, may provide a data value that may be moved as a subrow to the compute unit 460 as a group of 1K bits in parallel. Alternatively or in addition, a contiguous 1K columns, and coupled memory cells, may provide 1K data values that may be moved as a subrow to the compute unit 460 as a group of 1K bits in parallel. In either embodiment, among other potential embodiments, the groups of 1K bits may be moved sequentially in 16 cycles through the shared I/O lines 455 to 1K sensing circuitry units 450-1, . . . , 450-Z of 16 designated logic stripes 424-1, . . . , 424-N.

For example, a bit from a first sense amplifier and/or memory cell in a sequence of the first subrow 428-1 may be directed (e.g., by the controller 140) for storage by a first sensing circuitry units 450-1 in the sequence of sensing circuitry units in the first logic stripe 424-1. A bit from a second sense amplifier and/or memory cell in the sequence of the first subrow 428-1 may be directed for storage by a second sensing circuitry unit 450-2 in the sequence of sensing circuitry units in the first logic stripe 424-1. Further, a bit from a first sense amplifier and/or memory cell in a sequence of the second subrow 428-2 may be directed for storage by a first sensing circuitry units 450-1 in the sequence of sensing circuitry units in the second logic stripe 424-2. A bit from a second sense amplifier and/or memory cell in the sequence of the second subrow 428-2 may be directed for storage by a second sensing circuitry units 450-2 in the sequence of sensing circuitry units in the second logic stripe 424-2. Bits corresponding to each sense amplifier and/or memory cell in the sequence of subrows 428-2 428-1, . . . , 428-16 per row may similarly be designated for storage by a corresponding compute component, or an associated latch, in the sequence in the sequence of logic stripes 424-1, . . . , 424-N (e.g., data values from subrow 428-1 are moved to logic stripe 424-1, data values from subrow 428-2 are moved to logic stripe 424-2, etc.). Movement may be directed to a designated logic stripe via the shared I/O lines 455, which may provide a 1K bit wide data path to the compute unit 460.

In the example of FIG. 4, each logic stripe 424-1, . . . , 424-N may have a plurality of sensing circuitry units 450-1, . . . , 450-Z with compute components, latches, and/or sense amps, such as sense amps 206, compute components 231, and latches 264/215 that have been described herein in connection with the sensing circuitry 250 of FIG. 2. In some embodiments, each of the plurality of logic stripes 424-1, . . . , 424-N may be configured to perform a compute function using the plurality of sensing circuitry units 450-1, . . . , 450-Z. In some embodiments, each of the plurality of logic stripes 424-1, . . . , 424-Z may perform a different logical operation using the plurality of sensing circuitry units 450-1, . . . , 450-Z. For example, at least one of the plurality of logic stripes 424-1, . . . , 424-Z may be configured to perform an AND operation and at least one of the plurality of logic stripes 424-1, . . . , 424-Z may be configured to perform a NOR operation, among various combinations and/or sequences of logical operations.

In some embodiments, the each of the plurality of logic stripes 424-1, . . . , 424-Z may be coupled together so that data stored on one of the plurality of logic stripes 424-1, . . . , 424-Z can be moved to another the plurality of logic stripes 424-1, . . . , 424-Z. For example, after completing a logic operation on one of the plurality of logic stripes 424-1, . . . , 424-Z, the result of the logic operation can be moved to another of the plurality of logic stripes 424-1, . . . , 424-Z and a logic operation can be performed the result of the prior logic operation.

In some embodiments, the plurality of logic stripes 424-1, . . . , 424-Z may be split into a first portions of logic stripes 424-A, a second portion of logic stripes 424-B, and a third portion of logic stripes 424-C. The first portions of logic stripes 424-A, the second portion of logic stripes 424-B, and the third portion of logic stripes 424-C can each be configured to perform a program. The program can be comprised of a number of operations. The program can be performed by completing the operations using the logic stripes that comprise the portions of logic stripes. The logic stripes of a portion of logic stripes can be used from first to last and from last to first until all of the operations of the program have been completed.

In some embodiments, the controller 140 (FIG. 1A) associated with the bank section may execute microcode instructions to direct movement of the 1K data values in parallel from a corresponding 1K multiplexed columns in connection with a particular accessed subrow among the plurality of subarrays 425-1, . . . , 425-32 to a particular sensing circuitry units 450-1, . . . , 450-Z of a particular logic stripe 424-1, . . . , 424-N in the compute unit 460.

In some embodiments, the shared I/O lines may be used to connect the 1K data values to a respective one of the plurality of sensing circuitry units 450-1, . . . , 450-Z in a respective one of the plurality of logic stripes 424-1, . . . , 424-N. By way of example and not by way of limitation, 1K bits of the data values may be moved in parallel to a particular logic stripe associated with each subrow. In various embodiments, there may, for example, be a compute unit 460 associated with each of the 32 subarrays 425-1, . . . , 425-32 in each of 4 quadrants of a bank section 423 or compute units may be shared between various combinations of the subarrays, quadrants, and/or bank sections. Data values loaded to the plurality of sensing circuitry units 450-1, . . . , 450-Z in the logic stripes 424-1, . . . , 424-N of the compute unit 460 may be operated on according to microcode instructions from the controller 140 (FIG. 1A) to perform operations (e.g., AND, OR, NOR, XOR, add, subtract, multiply, divide, shift, etc.) on the data values as the same have been described herein in connection with the sensing circuitry 250 of FIG. 2.

As described herein, for example, once the 1K data values of a first subrow, e.g., subrow 428-1, and a second subrow, e.g., subrow 428-2, are moved (e.g., loaded) to a first logic stripe 424-1 of the compute unit 460, compute operations may be initiated on such data values before and/or substantially simultaneously with data values from a third subrow and fourth subrow being moved to a second logic stripe 424-2 of the compute unit 460. Such operations performed in the logic stripe of the compute unit may be controlled much faster (e.g., at speeds of approximately 2 ns) according to microcode instructions executed by the controller 140 (FIG. 1A) without having to move the data values back into the rows of the array 130 (FIG. 1A). For example, compute operations may be performed using the compute unit 460 at a much faster speed as compared to an example time (e.g., approximately 60 ns) that may be required to fire and access rows in the array 130 (FIG. 1A). As described in connection with FIG. 2, connection circuitry 232-1 and 232-2 may enable movement of sensed, stored, and/or data values of a logic stripe on which an operation has been performed between logic stripes without movement via a shared I/O line.

Accordingly, a memory device 120 may include, in various embodiments, a plurality of I/O lines shared as a data path for in data path compute operations associated with an array 130 of memory cells. The plurality of shared I/O lines may selectably couple a first subrow (e.g., 428-1) of a row of the array via the sensing circuitry (e.g., 350) to a first sensing circuitry unit (e.g., 450-1) in the data path to move a first data value from the first subrow to the first compute component. The plurality of shared I/O lines may selectably couple a second subrow (e.g., 428-2) of the respective row via the sensing circuitry to a second sensing circuitry unit in the data path to move a second data value from the second subrow to the second sensing circuitry unit. For example, the first logic stripe (e.g., 424-1) may include the first sensing circuitry unit and a second logic stripe (e.g., 424-2) may include the second sensing circuitry unit. As described herein, an operation may be performed on the first data value from the first subrow using the first compute component substantially simultaneously with movement of the second data value from the second subrow to the second compute component.

In various embodiments, the data path may further include the first logic stripe (e.g., 424-1) configured to include a number of a plurality of first sensing circuitry units (e.g., 450-1, . . . , 450-Z) that corresponds to a number of a plurality of memory cells (not shown) of the first subrow (e.g., 428-1) and the second logic stripe (e.g., 424-2) configured to include a number of a plurality of second sensing circuitry units that corresponds to a number of a plurality of memory cells of the second subrow (e.g., 428-2). A number of a plurality of logic stripes (e.g., 424-1, . . . , 424N) may correspond to a number of a plurality of subrows (e.g., 428-1, . . . , 428-16) of the respective row. A compute unit (e.g., 460) may be configured to include a plurality of logic stripes (e.g., 424-1, . . . , 424N) each configured to include a plurality of sensing circuitry units (e.g., 450-1, . . . , 450-Z), where each of the plurality of compute components may be associated with (e.g., selectably coupled to) at least one of the plurality of shared I/O lines 455 local to the array. A number of the plurality of shared I/O lines may correspond to a number of a plurality of memory cells of a subrow of the respective row (e.g., an individual shared I/O line for every 8 or 16 memory cells and/or columns of the subrow or row, among other possible configurations). A logic stripe (e.g., 424-1) may be configured to include a number of a plurality of sensing circuitry units (e.g., 450-1, . . . , 450-Z) that corresponds to the number of the plurality of memory cells of the subrow coupled to a respective logic stripe. In a number of embodiments, latches may be coupled to one or more of the plurality of logic stripes (e.g., 424-1, . . . , 424N). Data from the array and/or data that is a result of an operation may be stored in the latches. The operations may be interrupted (e.g., paused or stopped) and the results of the operation at the time of interrupting the operations may be stored in the latches and/or stored back to the array. The operations may continue at a later time by loading the data from the time of interrupting the operation to the logic stripes from the array and/or latches.

FIG. 5 is a block diagram illustrating an example of a controller 540 of a memory device 520 in accordance with a number of embodiments of the present disclosure. In some implementations, the block diagram of FIG. 5 provides greater detail of a portion of one example of a PIM capable device such as memory device 120 in FIGS. 1A and 1B. In the example of FIG. 5, a controller 540-1, . . . , 540-7 (referred to generally as controller 540) may be associated with each bank 521-1, . . . , 521-7 (referred to generally as bank 521) to the PIM capable device 520. Eight banks are shown in the example of FIG. 5. However, embodiments are not limited to this example number. Controller 540 may, for example, represent controller 140 shown in FIG. 1A. Each bank may include one or more arrays of memory cells (not shown). For example, each bank may include one or more arrays such as array 130 in FIG. 1A and may include decoders, other circuitry, and/or registers, as shown in FIG. 1A. In the example memory device 520 shown in FIG. 5, controllers 540-1, . . . , 540-7 are shown as having control logic 531-1, . . . , 531-7, sequencers 532-1, . . . , 532-7, and timing circuitry 533-1, . . . , 533-7 as part of a controller 540 on one or more memory banks 521 of a memory device 520. The PIM capable device 520 may represent part of memory device 120 shown in FIG. 1A.

As shown in FIG. 5, the memory device 520 may include a high speed interface (HSI) 541 to receive data, addresses, control signals, and/or commands at the PIM capable device 520. In various embodiments, the HSI 541 may be coupled to a bank arbiter 545 associated with the PIM capable device 520. The HSI 541 may be configured to receive commands and/or data from a host (e.g., 110 in FIG. 1A). As shown in FIG. 5, the bank arbiter 545 may be coupled to the plurality of banks 521-1, . . . , 521-7.

The control logic 531-1, . . . , 531-7 in the example shown in FIG. 5 may be in the form of a microcode engine responsible for fetching and executing machine instructions (e.g., microcode instructions) from an array of memory cells (e.g., array 130 in FIG. 1A) that is part of each bank 521-1, . . . , 521-7. The sequencers 532-1, . . . , 532-7 may also be in the form of microcode engines. Alternatively, the control logic 531-1, . . . , 531-7 may be in the form of a very large instruction word (VLIW) type processing resource and the sequencers 532-1, . . . , 532-7, and the timing circuitry 533-1, . . . , 533-7 may be in the form of state machines and transistor circuitry.

Figure 6:
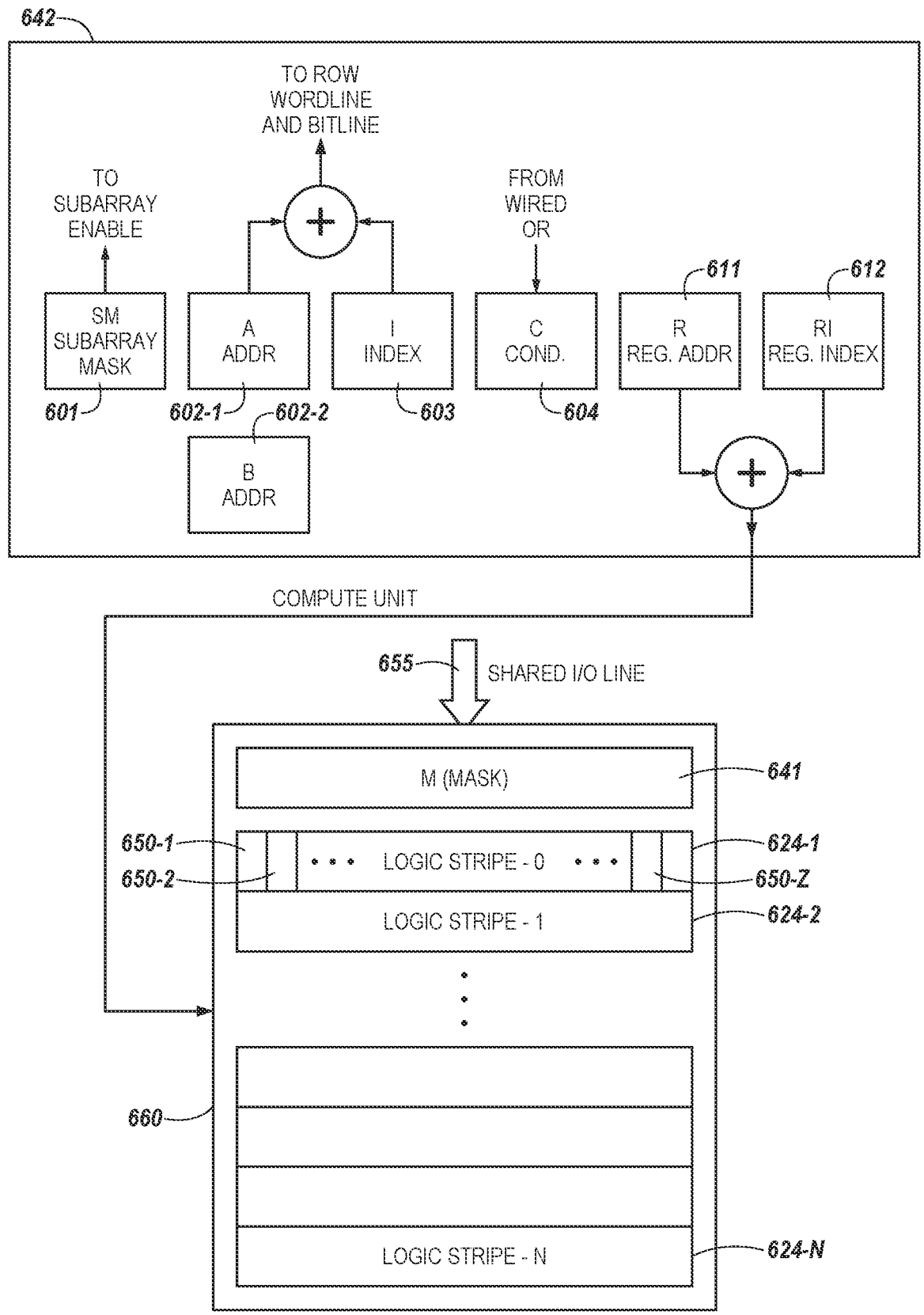
FIG. 6 is a block diagram illustrating another example of a controller of a memory device, the controller to control movement of data values to a compute unit, having a plurality of logic stripes, using a shared I/O line in accordance with a number of embodiments of the present disclosure.

The control logic 531-1, . . . , 531-7 may decode microcode instructions into function calls (e.g., microcode function calls (uCODE)) implemented by the sequencers 532-1, . . . , 532-7. FIG. 6 illustrates another embodiment of controller 540, shown as 642 in FIG. 6, which illustrates a more detailed portion of a sequencer according to embodiments of the present disclosure. The microcode function calls may be the operations that the sequencers 532-1, . . . , 532-7 receive and execute to cause the memory device 520 to perform particular logical operations using the sensing circuitry such as sensing circuitry 150 in FIG. 1A or using the sensing circuitry units 450-1, . . . , 450-Z and 650-1, . . . , 650-Z of the compute units 460 and 660 shown in FIGS. 4 and 6, respectively. The timing circuitry 533-1, . . . , 533-7 may provide timing to coordinate performance of the logical operations by the logic stripes 424-1, . . . , 424-N and 624-1, . . . , 624-N of the compute units 460 and 660 shown in FIGS. 4 and 6, respectively, and/or be responsible for providing conflict free access to the arrays, such as array 130 in FIG. 1A.

As described in connection with FIG. 1A, the controllers 540-1, . . . , 540-7 may be coupled to sensing circuitry 150, compute unit 460/660, and/or additional logic circuitry 170, including cache, buffers, sense amplifiers, extended row address (XRA) latches, and/or registers, associated with arrays of memory cells via control lines and data paths shown in FIG. 5 as 555-1, 555-7. As such, sensing circuitry 150, compute unit 460/660, and logic 170 shown in FIGS. 1A, 4 and 6 may be associated with the arrays of memory cells 130 (e.g., using shared I/O lines shown at 555-1, . . . , 555-7 in FIG. 5 and/or other I/O circuitry). The controllers 540-1, . . . , 540-7 may control regular DRAM operations for the arrays such as a read, write, copy, and/or erase operations, etc. Additionally, however, microcode instructions retrieved and executed by the control logic 531-1, . . . , 531-7 and the microcode function calls received and executed by the sequencers 532-1, . . . , 532-7 to cause sensing circuitry 150 and/or compute unit 460/660 shown in FIGS. 1A, 4 and 6 to perform additional logical operations such as addition, multiplication, or, as a more specific example, Boolean operations such as an AND, OR, XOR, etc., which are different (e.g., more complex) than regular DRAM read and write operations. Hence, in this example memory device 520, microcode instruction execution and/or logic operations may be performed on the banks 521-1, . . . , 521-7 of a PIM capable device.

In various embodiments, the control logic 531-1, . . . , 531-7, sequencers 532-1, . . . , 532-7, and timing circuitry 533-1, . . . , 533-7 may operate to generate sequences of operation cycles for a DRAM array and/or direct the performance of operations (e.g., logical operations) on the memory device 520 (e.g., on a bank 521-1, . . . , 521-7 including in a compute unit 460/660 in a data path of the shared I/O lines 455-1, 455-7). In the PIM capable device example, each sequence may be designed to perform operations, such as a Boolean logic operations AND, OR, XOR, etc., which together achieve a specific function. For example, the sequences of operations may repetitively perform a logical operation for a one (1) bit add in order to calculate a multiple bit sum. In another example, instructions for the sequences of operations may be executed to perform a number of alpha blend graphics operations, among various other types of operations. Each sequence of operations may be fed into a first in/first out (FIFO) buffer coupled to the timing circuitry 533-1, . . . , 533-7 to provide timing coordination with the sensing circuitry 150, compute unit 460/660, and/or additional logic circuitry 170 associated with the array of memory cells 130 (e.g., DRAM arrays) shown in FIG. 1A.

In the example PIM capable memory device 520 shown in FIG. 5, the timing circuitry 533-1, . . . , 533-7 may provide timing and may provide conflict free access to the arrays from four (4) FIFO queues and/or may coordinate timing to operations in the compute unit 460/660. In this example, one FIFO queue may support array computation, one for microcode (e.g., Ucode) instruction fetch, one may be for control of the data path related to the shared I/O lines, logic stripes, compute units, connection circuitry, etc., and one for DRAM I/O. Both the control logic 531-1, . . . , 531-7 and the sequencers 532-1, . . . , 532-7 may generate status information, which may be routed back to the bank arbiter 545 via a FIFO interface. The bank arbiter 545 may aggregate this status data and report it back to the host 110, for example, via HSI 541

FIG. 6 is a block diagram illustrating another example of a portion of a controller 642 of a memory device 520 (FIG. 5). The controller 642 is, among other functions, configured to control movement of data values to a compute unit 660, having a plurality of logic stripes 624-1, . . . , 624-N, using a shared I/O line 655 655 in a data path local to an array 130 (FIG. 1A) in accordance with a number of embodiments of the present disclosure. In the example of FIG. 6, the portion of the controller 642 is an example of a sequencer portion of a controller, such as sequencer 532 in FIG. 5.

Figure 7:
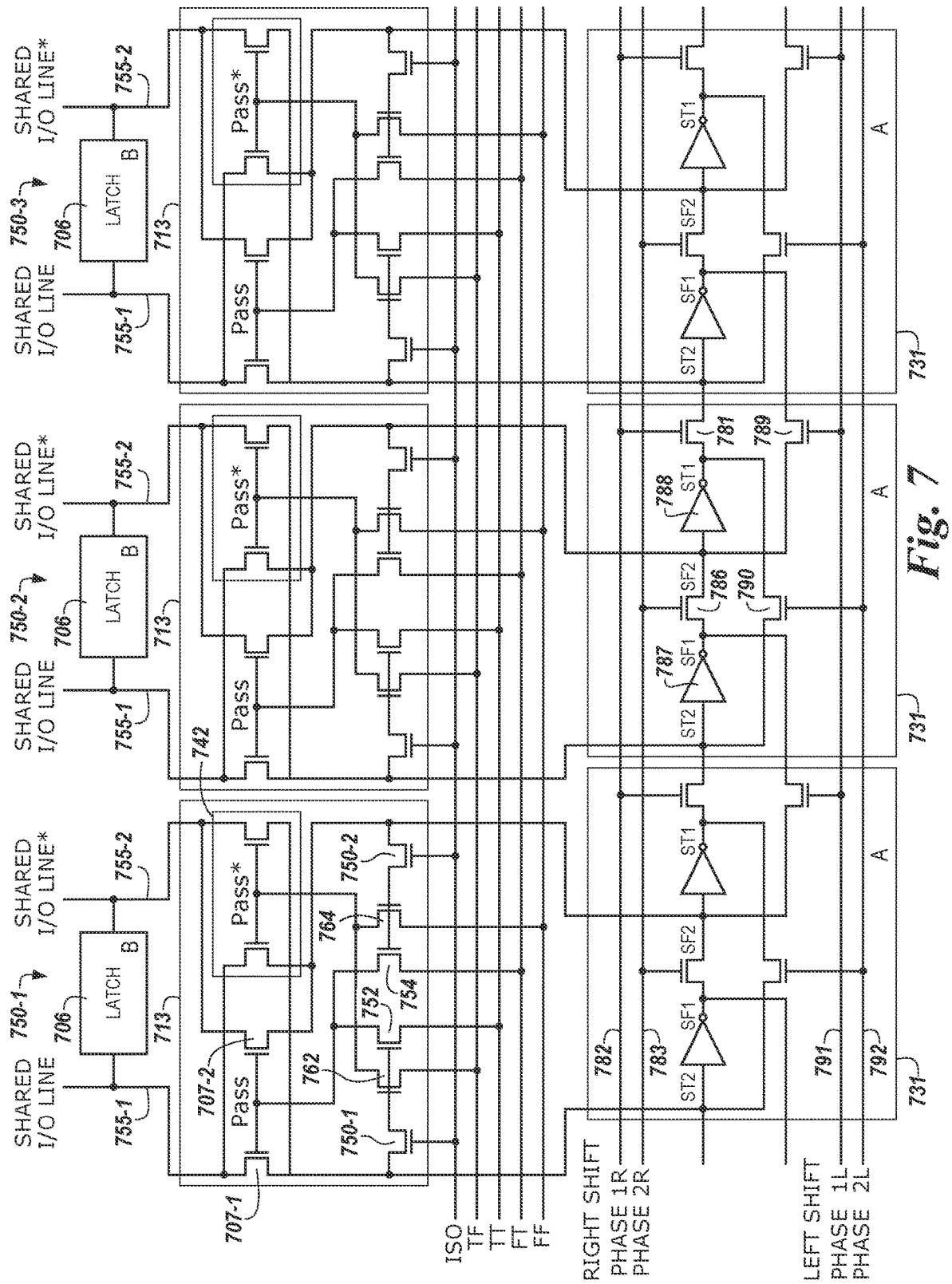
FIG. 7 is a schematic diagram illustrating sensing circuitry of a logic stripe in accordance with a number of embodiments of the present disclosure.

In the example embodiment of FIG. 6, the sequencer portion of the controller 642 may operate on three classes of microcode instruction: array operations, compute component operations, and control operations. As shown at 601, bit values may be provided as part of a subarray mask to identify a particular subarray in a quadrant of a bank section, as described above. At 602-1 and 602-2, A and B address pointers, associated with a primary latch and secondary latch as described in connection with the sensing circuitry 250 of FIG. 2 and shown in more detail as 731 (A) and 706 (B) in FIG. 7, provide pointers to physical addresses for data values in an array 130 (FIG. 1A). At 603, bit values may additionally provide an additional index into the array 130 (FIG. 1A). As shown in the example of FIG. 6, the address pointers 602-1 and 602-2 and index 603 are used to access particular row and sense lines (e.g., to row word lines and bit lines) of an array 130 (FIG. 1A).

The plurality of shared I/O lines 655 described herein may connect the array 130 (FIG. 1A) to the compute unit 660 in a data path of the shared I/O 655 local to the array. Instructions are provided from the controller 642 to the compute unit to load data values from the shared I/O line 655 to a given sensing circuitry unit 650-1, . . . , 650-Z in a given logic stripe 624-1, . . . , 624-N of the compute unit 660. A mask stripe 641 to the compute unit 660 may enable selecting a sense line and compute component value for reads or writes.

At 604, a condition code from a wired OR logic configuration may provide a bit value result of a wired OR operation with the compute unit 660. At 611 bit values may provide a register address as a pointer to a second register source for compute component operation instructions. At 612, bit values may indicate a register index of a logic stripe 624-1, . . . , 624-N of the compute unit 660 together with the register address pointer to a second register source for compute component operation instructions 611.

FIG. 7 is a schematic diagram illustrating sensing circuitry units 750 of a logic stripe (e.g., as shown at 124, 424, and 624 and described in connection with FIGS. 1B, 4, and 6) in accordance with a number of embodiments of the present disclosure. FIG. 7 also is a schematic diagram illustrating compute unit 460/660 circuitry capable of implementing logical operations in accordance with a number of embodiments of the present disclosure.

FIG. 7 shows sensing circuitry units 750-1, 750-2, and 750-3 each with a latch 706 directly coupled, in some embodiments, to a pair of complementary shared I/O lines 755-1 and 755-2 (e.g., as shown and described in connection with shared I/O line 355 in FIG. 3) and/or logical operation select logic 713, and a compute component 731 coupled to the latch 706 via pass gates 707-1 and 707-2. The latch 706 is shown in FIG. 7 to be directly coupled to the pair of complementary shared I/O lines 755-1 and 755-2 by way of illustration and not by way of limitation. For example, a shared I/O line may be a single shared I/O line 755 or may include the pair of complementary shared I/O lines shown in FIG. 7. Either embodiment of the shared I/O line may, in various embodiments, be selectably and/or directly coupled to the latch 706 to load (e.g., store) a first portion of data values from an array and/or selectably and/or directly coupled to the compute component 731 to load (e.g., store) a second portion of data values from the array to enable performance of a logical operation by the sensing circuitry 750 using the two stored data values.

In some embodiments, there may be a plurality of latches 706 associated with a compute component 731 such that the latches may, in various embodiments, be selectably, directly, and/or indirectly coupled to the shared I/O line to load a data value to each of the latches, which may then be selectably used (e.g., as directed by a controller) by an associated compute component for performance of a plurality of logical operations (e.g., as determined by the number of latches squared). Hence, pass gates 707-1 and 707-2 may be used in various embodiments to directly and/or indirectly couple the latches 706, compute components 731, and/or logical operation select logic 713 to each other and/or indirectly connect the shared I/O line 755 to the latches 706, compute components 731, and/or logical operation select logic 713.

The latch 706 shown in FIG. 7 may function in a manner analogous to the sense amplifier 206 (e.g., primary latch) shown in and described in connection with FIG. 2 as associated with sensing circuitry 250. The compute component 731 shown in FIG. 7 may function analogous to the compute component 231 (e.g., secondary latch) shown in FIG. 2 as associated with the sensing circuitry 250. The logical operation selection logic 713 shown in FIG. 7 may function analogous to the logical operation selection logic 213 shown in FIG. 2 associated with the sensing circuitry 250. The gates of the pass gates 707-1 and 707-2 may be controlled by a logical operation selection logic 713 signal, (e.g., Pass). For example, an output of the logical operation selection logic 713 may be coupled to the gates of the pass gates 707-1 and 707-2. Further, the compute component 731 may comprise a loadable shift register configured to shift data values left and right.

According to the embodiment illustrated in FIG. 7, the compute components 731 may comprise respective stages (e.g., shift cells) of a loadable shift register configured to shift data values left and right. For example, as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L may be applied to respective control lines 782, 783, 791 and 792 to enable/disable feedback on the latches of the corresponding compute components 731 in association with performing logical operations and/or shifting data in accordance with embodiments described herein.

The compute unit 460/660 circuitry shown in FIG. 7 shows operation selection logic 713 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary shared I/O lines 755-1 and 755-2 when isolation transistors 751-1 and 751-2 are enabled via an ISO control signal being asserted.

According to various embodiments, the operation selection logic 713 may include four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line through isolation transistor 751-1 (having a gate coupled to an ISO signal control line). Gates of logic selection transistors 764 and 754 are coupled to the complementary sense line through isolation transistor 751-2 (also having a gate coupled to an ISO signal control line).

Data values present on the pair of complementary shared I/O lines 755-1 and 755-2 may be loaded into the compute component 731 via the pass gates 707-1 and 707-2. The compute component 731 may comprise a loadable shift register. When the pass gates 707-1 and 707-2 are OPEN, data values ("A") on the pair of complementary shared I/O lines 755-1 and 755-2 are passed to the compute component 731 and thereby loaded into the loadable shift register. The data values on the pair of complementary shared I/O lines 755-1 and 755-2 may be the data value ("B") stored by the sense amplifier 706 when the sense amplifier is fired. In this example, the logical operation selection logic signal, Pass, is high to OPEN the pass gates 707-1 and 707-2.

The ISO, TF, TT, FT, and FF control signals may operate to select a logical function to implement based on the data value ("B") in the sense amplifier 706 and the data value ("A") in the compute component 731. In particular, the ISO, TF, TT, FT, and FF control signals are configured to select the logical function to implement independent from the data value present on the pair of complementary shared I/O lines 755-1 and 755-2 (although the result of the implemented logical operation may be dependent on the data value present on the pair of complementary shared I/O lines 755-1 and 755-2. For example, the ISO, TF, TT, FT, and FF control signals select the logical operation to implement directly since the data value present on the pair of complementary shared I/O lines 755-1 and 755-2 is not passed through logic to operate the gates of the pass gates 707-1 and 707-2.

Additionally, FIG. 7 shows swap transistors 742 configured to swap the orientation of the pair of complementary shared I/O lines 755-1 and 755-2 between the sense amplifier 706 and the compute component 731. When the swap transistors 742 are OPEN, data values on the pair of complementary shared I/O lines 755-1 and 755-2 on the sense amplifier 706 side of the swap transistors 742 are oppositely-coupled to the pair of complementary shared I/O lines 755-1 and 755-2 on the compute component 731 side of the swap transistors 742, and thereby loaded into the loadable shift register of the compute component 731.

The logical operation selection logic 713 signal Pass may be activated (e.g., high) to OPEN the pass gates 707-1 and 707-2 (e.g., conducting) when the ISO control signal line is activated and either the TT control signal is activated (e.g., high) with data value on the true shared I/O line is "1" or the FT control signal is activated (e.g., high) with the data value on the complement shared I/O line is "1."

The data value on the true shared I/O line being a "1" OPENs logic selection transistors 752 and 762. The data value on the complimentary shared I/O line being a "1" OPENs logic selection transistors 754 and 764. If the ISO control signal or either the respective TT/FT control signal or the data value on the corresponding shared I/O line (e.g., shared I/O line to which the gate of the particular logic selection transistor is coupled) is not high, then the pass gates 707-1 and 707-2 will not be OPENed by a particular logic selection transistor.

The logical operation selection logic signal Pass* may be activated (e.g., high) to OPEN the swap transistors 742 (e.g., conducting) when the ISO control signal line is activated and either the TF control signal is activated (e.g., high) with data value on the true shared I/O line is "1," or the FF control signal is activated (e.g., high) with the data value on the complement shared I/O line is "1." If either the respective control signal or the data value on the corresponding shared I/O line (e.g., shared I/O line to which the gate of the particular logic selection transistor is coupled) is not high, then the swap transistors 742 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary shared I/O lines together, which may be a disruptive configuration to be avoided.

The compute unit 460/660 circuitry illustrated in FIG. 7 is configured to select one of a plurality of logical operations to implement directly from the four logic selection control signals (e.g., logical operation selection is not dependent on the data value present on the pair of complementary shared I/O lines). Some combinations of the logic selection control signals may cause both the pass gates 707-1 and 707-2 and swap transistors 742 to be OPEN at the same time, which shorts the pair of complementary shared I/O lines 755-1 and 755-2 together. According to a number of embodiments of the present disclosure, the logical operations which may be implemented by the compute unit 460/660 circuitry illustrated in FIG. 7 may be the logical operations summarized in the logic tables shown in FIG. 8.

Figure 8:
FIG. 8 is a logic table illustrating selectable logic operation results implemented by sensing circuitry shown in FIG. 7 in accordance with a number of embodiments of the present disclosure.

FIG. 8 is a logic table illustrating selectable logic operation results implemented by sensing circuitry 750 in FIG. 7 in accordance with a number of embodiments of the present disclosure. The selectable logic operation results may be implemented by compute unit 460/660 circuitry in a data path of a plurality of shared I/O lines 755-1 and 755-2 shown in FIG. 7. The four logic selection control signals (e.g., TF, TT, FT, and FF), in conjunction with a particular data value present on the complementary shared I/O lines, may be used to select one of plural logical operations to implement involving the starting data values ("A" and "B") stored by the sense amplifier 706 (e.g., primary latch) and compute component 731 (e.g., secondary latch) of the compute unit 460/660 circuitry. The four control signals, in conjunction with a particular data value present on the complementary shared I/O lines, control the continuity of the pass gates 707-1 and 707-2 and swap transistors 742, which in turn affect the data value in the compute component 731 and/or sense amplifier 706 before/after firing. The capability to selectably control continuity of the swap transistors 742 facilitates implementing logical operations involving inverse data values (e.g., inverse operands and/or inverse result), among others.

Logic Table 8-1 illustrated in FIG. 8 shows a starting data value stored by the compute component 731 (e.g., secondary latch) shown in column A at 844, and a starting data value stored by the latch (e.g., sense amplifier 706 as a primary latch) shown in column B at 845. The other 3 column headings in Logic Table 8-1 refer to the continuity of the pass gates 707-1 and 707-2, and the swap transistors 742, which may respectively be controlled to be OPEN or CLOSED depending on the state of the four logic selection control signals (e.g., TF, TT, FT, and FF), in conjunction with a particular data value present on the pair of complementary shared I/O lines 755-1 and 755-2. The "Not Open" column corresponds to the pass gates 707-1 and 707-2 and the swap transistors 742 both being in a non-conducting condition, the "Open True" corresponds to the pass gates 707-1 and 707-2 being in a conducting condition, and the "Open Invert" corresponds to the swap transistors 742 being in a conducting condition. The configuration corresponding to the pass gates 707-1 and 707-2 and the swap transistors 742 both being in a conducting condition is not reflected in Logic Table 8-1 since this results in the sense lines being shorted together.

Via selective control of the continuity of the pass gates 707-1 and 707-2 and the swap transistors 742, each of the three columns of the upper portion of Logic Table 8-1 may be combined with each of the three columns of the lower portion of Logic Table 8-1 to provide 3×3=9 different result combinations, corresponding to nine different logical operations, as indicated by the various connecting paths shown at 875. The nine different selectable logical operations that may be implemented by the compute unit 460/660 circuitry are summarized in Logic Table 8-2 illustrated in FIG. 8, including AND, OR, NOT, NOT, NAND, NOR, and XOR logical operations.

The columns of Logic Table 8-2 illustrated in FIG. 8 show a heading 880 that includes the state of logic selection control signals. For example, the state of a first logic selection control signal is provided in row 876 of the table 8-2, the state of a second logic selection control signal is provided in row 877 of the table 8-2, the state of a third logic selection control signal is provided in row 878 of the table 8-2, and the state of a fourth logic selection control signal is provided in row 879 of the table 8-2. The particular logical operation corresponding to the results is summarized in row 847 of the table 8-2.

Figure 9B:
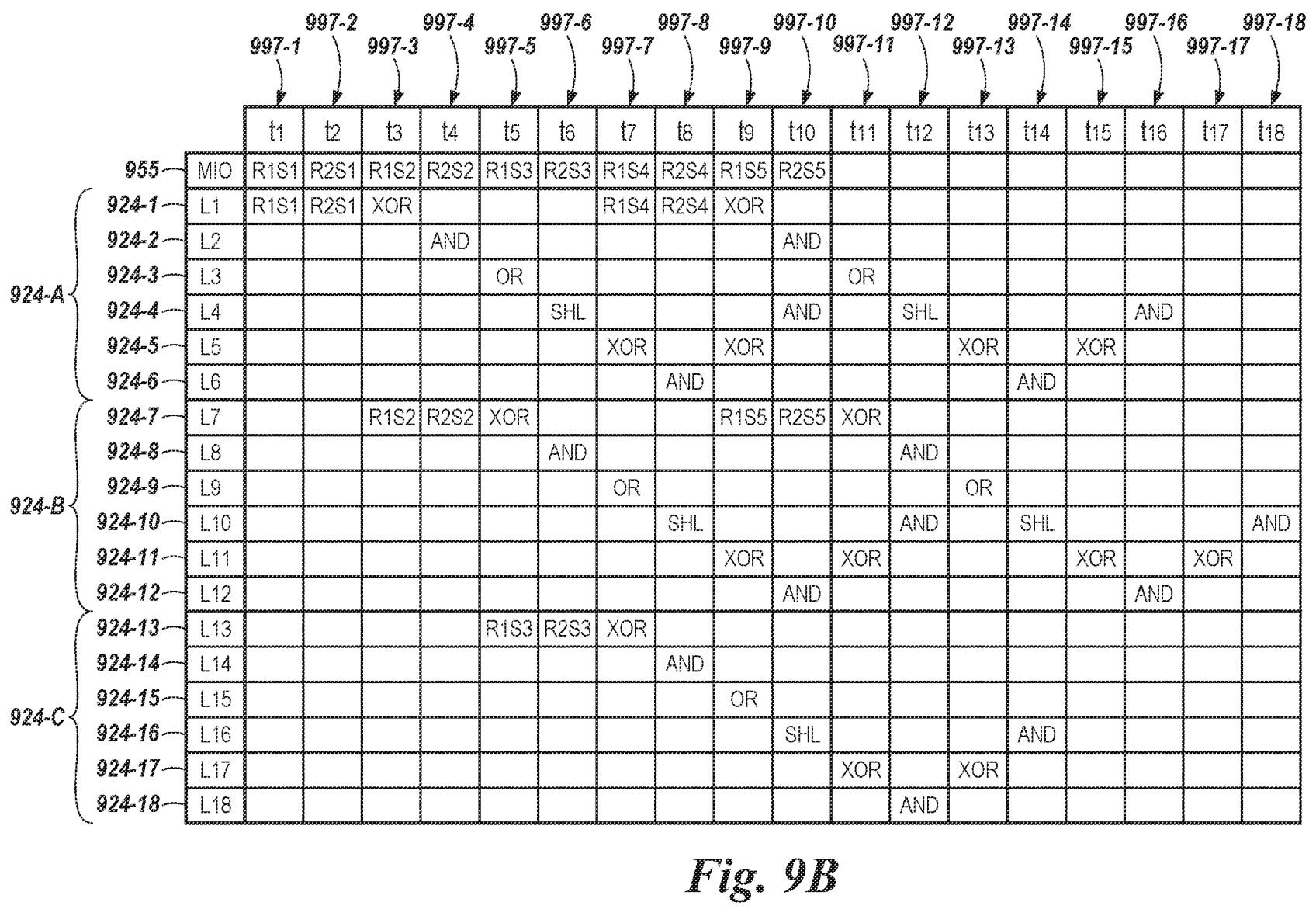

FIGS. 9A-9B are schematic diagrams illustrating performance of operations on data values in a memory device in accordance with a number of embodiments of the present disclosure. FIGS. 9A and 9B illustrate 18 logic stripes at 924-1, 924-2, . . . , 924-18, which are labeled L1, L2, . . . , L18. As described herein, a memory device (e.g., 120 in FIGS. 1A and 1B) may include an array of memory cells (e.g., 130 in FIG. 1A) and sensing circuitry (e.g., 150 and 250 in FIGS. 1A and 2) selectably coupled to the array of memory cells. The memory device may further include a plurality of I/O lines (e.g., 155, 355, 455, 555, 655, 755 in FIGS. 1 and 3-7, respectively) shared as a data path for in data path compute operations associated with the array. The plurality of shared I/O lines may selectably couple the sensing circuitry to a logic stripe 924-1, 924-2, . . . , 924-18 in the data path of the shared I/O lines.

A controller (e.g., 140 in FIGS. 1A and 1B) may be associated with the array. The controller 140 may be configured to direct movement, via the sensing circuitry, of a data values from subrows (e.g., 428-1 in FIG. 4) of an array via the shared I/O lines to logic stripes (e.g., 424-1 in FIG. 4).

As such, the controller may direct performance of a program (e.g., a sequence of operations comprising any number and/or combination of AND, OR, NOT, NOT, NAND, NOR, and XOR logical operations and/or other operations, such as invert, shift, arithmetic, statistics, among many other possible operations) on data values stored and/or moved to the logic stripes.

The plurality of shared I/O lines described herein may be configured, as directed by the controller, to selectably couple to the sensing circuitry to selectably enable, via a multiplexer (which may include or be the column select circuitry shown at 358 and described in connection with FIG. 3), parallel movement of a number of a plurality of data values stored by the sensing circuitry that corresponds to a subrows of the array.

Portions 924-A, 924-B, and 924-C are each shown to include six logic stripes (e.g., logic stripes 924-1 (L1), . . . , 924-6 (L6) in region 924-A, logic stripes 924-7 (L7), . . . , 924-12 (L12) in region 924-B, and logic stripes 924-13 (L13), . . . , 924-18 (L18) in region 924-C). Each of the logic stripe portions 924-A, 924-B, and 924-C can be configured to perform a program. The program performed by logic stripe portion 924-A, 924-B, and 924-C can be the same program and/or each logic stripe portion 924-A, 924-B, and 924-C can perform different programs.

In FIG. 9A, data from the array can be transferred to the logic stripes and program can be performed in each logic stripe portion 924-A, 924-B, and 924-C simultaneously. Data from row 1 subarray 1 (R1S1) can be transferred to logic stripe L1 924-1 via shared I/O 955 during time $t_1$ 997-1 and data from row 2 subarray 1 (R2S1) can be transferred to logic stripe L1 924-1 via shared I/O 955 during time $t_2$ 997-2. At time $t_3$ 997-3, portion 924-A can begin performing a program by performing an XOR operation on data from R1S1 and R2S1 in logic stripe 924-1 while data from row 1 subarray 2 (R1S2) is transferred to logic stripe L7 924-7 via shared I/O 955. At time $t_4$ 997-4, portion 924-A continues performing the program by performing an AND operation on the data from R1S1 and vector 0xF in logic stripe 924-2 while data from row 2 subarray 2 (R2S2) is transferred to logic stripe L7 924-7 via shared I/O 955.

At time $t_5$ 997-5, portion 924-A continues performing the program by performing an OR operation on the result of the AND operation and the result of the XOR operation while portion 924-B can begin performing a program by performing an XOR operation on data from R1S2 and R2S2 in logic stripe 924-7 and while data from row 1 subarray 3 (R1S3) is transferred to logic stripe L13 924-13 via shared I/O 955.

At time $t_6$ 997-6, portion 924-A continues performing the program by performing a shift left (SHL) operation on the result of the OR operation by vector 0x1 in logic stripe L4 924-4 and portion 924-B continues performing the program by performing an AND operation on the data from R1S2 and vector 0xF in logic stripe 924-8 while data from row 2 subarray 2 (R2S3) is transferred to logic stripe L13 924-13 via shared I/O 955.

At time $t_7$ 997-7, portion 924-A continues performing the program by performing an XOR operation on the result of the SHL operation and vector 0x1 in logic stripe L5 924-5 and portion 924-B continues performing the program by performing an OR operation on the result of the AND operation and the result of the XOR operation in logic stripe 924-9 and portion 924-C can begin performing a program by performing an XOR operation on data from R1S3 and R2S3 in logic stripe 924-13 while data from row 1 subarray 4 (R1S4) is transferred to logic stripe L1 924-1 via shared I/O 955.

At time $t_8$ 997-8, portion 924-A continues performing the program by performing an AND operation on the result of the XOR operation and data from R1S1 in logic stripe L6 924-6, portion 924-B continues performing the program by performing a shift left (SHL) operation on the result of the OR operation by vector 0x1 in logic stripe L10 924-10, and portion 924-C can begin performing a program by performing an AND operation on the data from R1S3 and vector 0xF in logic stripe 924-14 while data from row 2 subarray 4 (R2S4) is transferred to logic stripe L1 924-1 via shared I/O 955.

The program performed in portion 924-A can be completed during $t_8$ 997-8 and the data can be stored in an extra latch of logic stripe 924-6 and/or send back to the array via shared I/O 955. Portion 924-A can begin performing the program during t9, 997-9 on data that was transferred to logic stripe 924-1 during t7 997-7 and t8 997-8. Portions 924-A, 924-B, and 924-C can be configured so that data is transferred via shared I/O 955 with a schedule such that continuously and simultaneously perform their respective programs.

At time $t_9$ 997-9, portion 924-A can begin performing a program by performing an XOR operation on data from R1S4 and R2S4 in logic stripe 924-1, portion 924-B continues performing the program by performing an XOR operation on the result of the SHL operation and vector 0x1 in logic stripe L11 924-11 and portion 924-C continues performing the program by performing an OR operation on the result of the AND operation and the result of the XOR operation in logic stripe 924-15 while data from row 1 subarray 5 (R1S2) is transferred to logic stripe L7 924-7 via shared I/O 955.

At time $t_{10}$ 997-10, portion 924-A continues performing the program by performing an AND operation on the data from R1S4 and vector 0xF in logic stripe 924-2, portion 924-B continues performing the program by performing an AND operation on the result of the XOR operation and data from R1S2 in logic stripe L12 924-12, and portion 924-C continues performing the program by performing a shift left (SHL) operation on the result of the OR operation by vector 0x1 in logic stripe L16 924-16 while data from row 2 subarray 5 (R2S5) is transferred to logic stripe L7 924-7 via shared I/O 955.

The program performed in portion 924-B can be completed during $t_{10}$ 997-10 and the data can be stored in an extra latch of logic stripe 924-12 and/or send back to the array via shared I/O 955. Portion 924-B can begin performing the program during $t_{11}$ 997-11 on data that was transferred to logic stripe 924-7 during $t_9$ 997-9 and $t_{10}$ 997-10.

At time $t_{11}$ 997-11, portion 924-continues performing the program by performing an OR operation on the result of the AND operation and the result of the XOR operation, portion 924-B can begin performing a program by performing an XOR operation on data from R1S5 and R2S5 in logic stripe 924-7, and portion 924-C continues performing the program by performing an XOR operation on the result of the SHL operation and vector 0x1 in logic stripe L17 924-17.

At time $t_{12}$ 997-12, portion 924-A continues performing the program by performing a shift left (SHL) operation on the result of the OR operation by vector 0x1 in logic stripe L4 924-4, portion 924-B continues performing the program by performing an AND operation on the data from R1S5 and vector 0xF in logic stripe 924-8, and portion 924-C continues performing the program by performing an AND operation on the result of the XOR operation and data from R1S5 in logic stripe L18 924-18.

The program performed in portion 924-C can be completed during $t_{10}$ 997-12 and the data can be stored in an extra latch of logic stripe 924-18 and/or send back to the array via shared I/O9 955.

At time $t_{13}$ 997-13, portion 924-A continues performing the program by performing an XOR operation on the result of the SHL operation and vector 0x1 in logic stripe L5 924-5 and portion 924-B continues performing the program by performing an OR operation on the result of the AND operation and the result of the XOR operation in logic stripe 924-9.

At time $t_{14}$ 997-14, portion 924-A continues performing the program by performing an AND operation on the result of the XOR operation and data from R1S4 in logic stripe L6 924-6 and portion 924-B continues performing the program by performing a shift left (SHL) operation on the result of the OR operation by vector 0x1 in logic stripe L10 924-10.

The program performed in portion 924-A can be completed during $t_{14}$ 997-14, which is the second program completed by portion 924-A in this example, and the data can be stored in an extra latch of logic stripe 924-6 and/or send back to the array via shared I/O9 955.

At time $t_{15}$ 997-15, portion 924-B continues performing the program by performing an XOR operation on the result of the SHL operation and vector 0x1 in logic stripe L11 924-11 and at time $t_{16}$ 997-16 portion 924-B continues performing the program by performing an AND operation on the result of the XOR operation and data from R1S5 in logic stripe L12 924-12.

The program performed in portion 924-B can be completed during $t_{16}$ 997-16, which is the second program completed by portion 924-B in this example, and the data can be stored in an extra latch of logic stripe 924-12 and/or send back to the array via shared I/O9 955.

In the example illustrated in FIG. 9A, programs can be performed simultaneously in portions 924-A, 924-B, and 924-C and the can be sent to the portions 924-A, 924-B, and 924-C such that once a program is completed the portion can begin performing the program again.

In FIG. 9B, data can be transferred to the logic stripes and programs can be performed by logic stripe portions 924-A, 924-B, and 924-C simultaneously and a program and/or programs can be performed simultaneously by a particular log stripe portion. Data from row 1 subarray 1 (R1S1) can be transferred to logic stripe L1 924-1 via shared I/O 955 during time $t_1$ 997-1 and data from row 2 subarray 1 (R2S1) can be transferred to logic stripe L1 924-1 via shared I/O 955 during time $t_2$ 997-2. At time $t_3$ 997-3, portion 924-A can begin performing a program by performing an XOR operation on data from R1S1 and R2S1 in logic stripe 924-1 while data from row 1 subarray 2 (R1S2) is transferred to logic stripe L7 924-7 via shared I/O 955. At time $t_4$ 997-4, portion 924-A continues performing the program by performing an AND operation on the data from R1S1 and vector 0xF in logic stripe 924-2 while data from row 2 subarray 2 (R2S2) is transferred to logic stripe L7 924-7 via shared I/O 955.

At time $t_5$ 997-5, portion 924-A continues performing the program by performing an OR operation on the result of the AND operation and the result of the XOR operation while portion 924-B can begin performing a program by performing an XOR operation on data from R1S2 and R2S2 in logic stripe 924-7 and while data from row 1 subarray 3 (R1S3) is transferred to logic stripe L13 924-13 via shared I/O 955.

At time $t_6$ 997-6, portion 924-A continues performing the program by performing a shift left (SHL) operation on the result of the OR operation by vector 0x1 in logic stripe L4 924-4 and portion 924-B continues performing the program by performing an AND operation on the data from R1S2 and vector 0xF in logic stripe 924-8 while data from row 2 subarray 2 (R2S3) is transferred to logic stripe L13 924-13 via shared I/O 955.

At time $t_7$ 997-7, portion 924-A continues performing the program by performing an XOR operation on the result of the SHL operation and vector 0x1 in logic stripe L5 924-5 and portion 924-B continues performing the program by performing an OR operation on the result of the AND operation and the result of the XOR operation in logic stripe 924-9 and portion 924-C can begin performing a program by performing an XOR operation on data from R1S3 and R2S3 in logic stripe 924-13 while data from row 1 subarray 4 (R1S4) is transferred to logic stripe L1 924-1 via shared I/O 955.

At time $t_8$ 997-8, portion 924-A continues performing the program by performing an AND operation on the result of the XOR operation and data from R1S1 in logic stripe L6 924-6, portion 924-B continues performing the program by performing a shift left (SHL) operation on the result of the OR operation by vector 0x1 in logic stripe L10 924-10, and portion 924-C can begin performing a program by performing an AND operation on the data from R1S3 and vector 0xF in logic stripe 924-14 while data from row 2 subarray 4 (R2S4) is transferred to logic stripe L1 924-1 via shared I/O 955.

At time $t_9$ 997-9, portion 924-A continues performing the program by performing an XOR operation on the result of the AND operation and vector 0x1 in logic stripe L5 924-5 and can begin performing a program by performing an XOR operation on data from R1S4 and R2S4 in logic stripe 924-1. Therefore portion 924-A is performing two programs simultaneously. Portion 924-B continues performing the program by performing an XOR operation on the result of the SHL operation and vector 0x1 in logic stripe L11 924-11 and portion 924-C continues performing the program by performing an OR operation on the result of the AND operation and the result of the XOR operation in logic stripe 924-15 while data from row 1 subarray 5 (R1S2) is transferred to logic stripe L7 924-7 via shared I/O 955.

At time $t_{10}$ 997-10, portion 924-A continues performing the programs by performing an AND operation on the data from R2S4 and vector 0xF in logic stripe 924-2 and performing an AND operation on the data from R1S4 and the result of the XOR operation in logic stripe 924-4, portion 924-B continues performing the program by performing an AND operation on the result of the XOR operation and data from R1S2 in logic stripe L12 924-12, and portion 924-C continues performing the program by performing a shift left (SHL) operation on the result of the OR operation by vector 0x1 in logic stripe L16 924-16 while data from row 2 subarray 5 (R2S5) is transferred to logic stripe L7 924-7 via shared I/O 955. The first program performed in portion 924-A can be completed during $t_{10}$ 997-10 and the data can be stored in an extra latch of logic stripe 924-4 and/or send back to the array via shared I/O 955.

At time $t_{11}$ 997-11, portion 924-A continues performing the program by performing an OR operation on the result of the AND operation and the result of the XOR operation, portion 924-B continues performing the program by performing an XOR operation on the result of the AND operation and vector 0x1 in logic stripe L11 924-11 and can begin performing a program by performing an XOR operation on data from R1S5 and R2S5 in logic stripe 924-7. Therefore portion 924-B is performing two programs simultaneously. Portion 924-C continues performing the program by performing an XOR operation on the result of the SHL operation and vector 0x1 in logic stripe L17 924-17.

At time $t_{12}$ 997-12, portion 924-A continues performing the program by performing a shift left (SHL) operation on the result of the OR operation by vector 0x1 in logic stripe L4 924-4, portion 924-B continues performing the programs by performing an AND operation on the data from R1S5 and vector 0xF in logic stripe 924-8 and performing an AND operation on the data from R2S5 and the result of the XOR operation in logic stripe 924-10, and portion 924-C continues performing the program by performing an AND operation on the result of the XOR operation and data from R1S5 in logic stripe L18 924-18. The first program performed in portion 924-B can be completed during $t_{12}$ 997-12 and the data can be stored in an extra latch of logic stripe 924-10 and/or send back to the array via shared I/O 955.

At time $t_{13}$ 997-13, portion 924-A continues performing the program by performing an XOR operation on the result of the SHL operation and vector 0x1 in logic stripe L5 924-5 and portion 924-B continues performing the program by performing an OR operation on the result of the AND operation and the result of the XOR operation in logic stripe 924-9. Portion 924-C continues performing the program by performing an XOR operation on the result of the AND operation and vector 0x1 in logic stripe L17 924-17

At time $t_{14}$ 997-14, portion 924-A continues performing the program by performing an AND operation on the result of the XOR operation and data from R1S4 in logic stripe L6 924-6, portion 924-B continues performing the program by performing a shift left (SHL) operation on the result of the OR operation by vector 0x1 in logic stripe L10 924-10, and portion 924-C performing an AND operation on the data from R2S6 and the result of the XOR operation in logic stripe 924-17. The program performed in portion 924-C can be completed during $t_{14}$ 997-14 and the data can be stored in an extra latch of logic stripe 924-17 and/or send back to the array via shared I/O 955.

At time $t_{15}$ 997-15, portion 924-A continues performing the program by performing an XOR operation on the result of the AND operation and vector 0x1 in logic stripe L5 924-5 and portion 924-B continues performing the program by performing an XOR operation on the result of the SHL operation and vector 0x1 in logic stripe L11 924-11.

At time $t_{16}$ 997-16, portion 924-A continues performing an AND operation on the data from R2S4 and the result of the XOR operation in logic stripe 924-4 and portion 924-B continues performing the program by performing an AND operation on the result of the XOR operation and data from R1S5 in logic stripe L12 924-12. The second program performed in portion 924-A can be completed during $t_{16}$ 997-16 and the data can be stored in an extra latch of logic stripe 924-4 and/or send back to the array via shared I/O 955.

At time $t_{17}$ 997-17, portion 924-B continues performing the program by performing an XOR operation on the result of the AND operation and vector 0x1 in logic stripe L11 924-11 and, at time $t_{18}$ 997-18, portion 924-B continues performing an AND operation on the data from R2S5 and the result of the XOR operation in logic stripe 924-10. The second program performed in portion 924-B can be completed during $t_{18}$ 997-18 and the data can be stored in an extra latch of logic stripe 924-10 and/or send back to the array via shared I/O 955.

In the example illustrated in FIG. 9B, programs can be performed simultaneously in portions 924-A, 924-B, and 924-C and data can be sent to the portions 924-A, 924-B, and 924-C such that a particular portion of logic stripes can perform programs simultaneously.

Accordingly, embodiments described herein provide a method for operating a memory device for in data path compute operations performed by execution of non-transitory instructions by a processing resource. The set of non-transitory instructions may, as described herein, be executed by a controller and/or a sub-controller via a processing resource for the array, the shared I/O line, the plurality of logic stripes, and/or the connection circuitry, among other components.

While example embodiments including various combinations and configurations of sensing circuitry, sense amplifiers, compute components, latches, logic stripes, shared I/O lines, column select circuitry, connection circuitry, multiplexers, etc., have been illustrated and described herein, embodiments of the present disclosure are not limited to those combinations explicitly recited herein. Other combinations and configurations of the sensing circuitry, sense amplifiers, compute components, latches, logic stripes, shared I/O lines, column select circuitry, connection circuitry, multiplexers, etc., disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a processor; and
a memory device, coupled to the processor, including:
an array of memory cells;
sensing circuitry selectably coupled to the array of memory cells; and
a controller associated with the array,
wherein the processor is configured to send a command to the memory device; and wherein the controller of the memory device is configured to receive the command from the processor and execute instruction in the command via the controller that is configured to:
direct movement of a first portion of data from a first subrow of a first row of the array and a second portion of data from a first subrow of a second row of the array to a first logic stripe of a first portion of logic stripes;
direct performance of a first operation on the first portion of data and the second portion of data using the first logic stripe of the first portion of logic stripes during a first time period;
send a result of the first operation to the processor and direct movement of the result of the first operation to a second logic stripe of the first portion of logic stripes;
direct movement of a third portion of data from a third subrow of the first row of the array to the second logic stripe of the first portion of logic stripes;
direct performance of a second operation on the result of the first operation and the third portion of data using the second logic stripe during a second time period; and
direct movement of the result of the second operation from the second logic stripe to a third logic stripe of the first portion of logic stripes in response to completion of the second operation.

2. The system of claim 1, wherein the controller is further configured to:
direct movement of the result of the first operation from the first logic stripe to the second logic stripe of the first portion of logic stripes in response to completion of the first operation.

3. The system of claim 1, wherein the controller is further configured to
interrupt performance of the second operation on the second logic stripe of the first portion of logic stripes and direct the result of the first operation to a third logic stripe of the first portion of logic stripes.

4. The system of claim 1, wherein the controller is further configured to:
direct movement of a fourth portion of data from the array to a first logic stripe of a second portion of logic stripes during the first time period.

5. The system of claim 4, wherein the controller is further configured to:
direct performance of the first operation on the fourth portion of data using the first logic stripe of the second portion of logic stripes during the second time period.

6. The system of claim 5, wherein the controller is further configured to:
direct movement of the result of the first operation from the first logic stripe to a second logic stripe of the second portion of logic stripes in response to completion of the first operation.

7. A system, comprising:
a processor; and
a memory device, coupled to the processor, including:
an array of memory cells;
sensing circuitry selectably coupled to the array of memory cells; and
a controller associated with the array,
wherein the processor is configured to send a command to the memory device; and wherein the controller of the memory device is configured to receive the command from the processor and execute the command by:

directing movement of data from a first subrow of a first row of the array and data from a first subrow of a second row of the array to a first logic stripe during a first time period;

directing movement of data from a second subrow of the first row of the array and data from a second subrow of the second row of the array to a second logic stripe and performance of a first number of operations on the data from the first subrow of the first row of the array and data from the first subrow of the second row using the first logic stripe during a second time period.

8. The system of claim 7, wherein the controller is configured to execute the command by:

directing performance of a second number of operations on the data from the second subrow of the first row of the array and data from the second subrow of the second row during the second time period, wherein the first time period and the second time period at least partially overlap and wherein results of the second number of operations move between the plurality of logic stripes.

9. The system of claim 7, wherein the controller is configured to execute the command by:

directing performance of the first number of operations using the first portion of logic stripes by performing each successive operation of the first number of operations on successive logic stripes of the first portion of logic stripes.

10. The system of claim 8, wherein a second portion of logic stripes includes the second logic stripe.

11. The system of claim 10, wherein the controller is configured to execute the command by:

directing performance of the second number of operations using the second portion of logic stripes.

12. The system of claim 10, wherein the controller is configured to execute the command by:

directing performance of the second number of operations using the second portion of logic stripes by performing each successive operation of the second number of operations on successive logic stripes of the second portion of logic stripes.

13. An apparatus, comprising:
an array of memory cells;
sensing circuitry selectably coupled to the array of memory cells;
a controller associated with the array; and
a plurality of logic stripes;
wherein the plurality of logic stripes include a first portion of logic stripes, a second portion of logic stripes, a third portion of logic stripes, and a fourth portion of logic stripes; and
wherein the controller is configured to cause the first portion of logic stripes to perform a first number of operations on a first portion of data moved from the array of memory cells to the first portion of logic stripes while the second portion of logic stripes perform a second number of operations on a second portion of data moved from the array of memory cells to the second portion of logic stripes during a first time period;
wherein the controller is configured to direct movement of the result of the first operation to a third portion of logic stripes, direct performance of a third number of operations on the result of the first operation using the third logic stripe during a second time period, and direct movement of the result of the third number of operations from the third portion of logic stripes to a fourth portion of logic stripes in response to completion of the third operation.

14. The apparatus of claim 13, wherein each of the plurality of logic stripes each include a plurality of compute components.

15. The apparatus of claim 13, wherein the plurality of logic stripes include a fourth portion of logic stripes that perform a fourth number of operations during the first time period on a third portion of data moved from the array of memory cells to the fourth portion of logic stripes.

16. The apparatus of claim 13, wherein the first number of operations are the same as the second number of operations.

17. The apparatus of claim 13, wherein the first number of operations are different than the second number of operations.

18. The apparatus of claim 13, wherein the first portion of logic stripes perform the first number of operations on a fourth portion of data moved from the array of memory cells to the first portion of logic stripes during a second time period.

19. The apparatus of claim 18, wherein the second portion of logic stripes perform the second number of operations on a fifth portion of data moved from the array of memory cells to the second portion of logic stripes during the second time period.

* * * * *